(12) United States Patent
Okumura

(10) Patent No.: US 10,074,634 B2
(45) Date of Patent: *Sep. 11, 2018

(54) SEMICONDUCTOR DEVICE COMPRISING PN JUNCTION DIODE AND SCHOTTKY BARRIER DIODE

(71) Applicant: ROHM CO., LTD., Kyoto (JP)

(72) Inventor: Keiji Okumura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/908,086

(22) Filed: Feb. 28, 2018

(65) Prior Publication Data

US 2018/0190624 A1  Jul. 5, 2018

Related U.S. Application Data

(63) Continuation of application No. 15/609,407, filed on May 31, 2017, now Pat. No. 9,917,074, which is a (Continued)

(30) Foreign Application Priority Data

May 27, 2010 (JP) .................................. 2010-121375

(51) Int. Cl.
 *H01L 29/15* (2006.01)
 *H01L 25/07* (2006.01)
 (Continued)

(52) U.S. Cl.
 CPC ........ *H01L 25/072* (2013.01); *H01L 23/3121* (2013.01); *H01L 24/06* (2013.01);
 (Continued)

(58) Field of Classification Search
 CPC ... H01L 25/072; H01L 23/3121; H01L 24/06; H01L 24/46; H01L 29/1608; H01L 29/78; H02M 7/003
 (Continued)

(56) References Cited

U.S. PATENT DOCUMENTS 5,689,164 A  11/1997  Hoft et al.
5,945,801 A   8/1999  Yamada et al.
(Continued)

FOREIGN PATENT DOCUMENTS

JP  01-125018 A   5/1989
JP  5-316725      11/1993
(Continued)

OTHER PUBLICATIONS

Makoto Yokota et al., "Low-Voltage Power MOSFETs Achieving High Performance and Low Cost", Toshiba Review, vol. 65, No. 1, Jan. 1, 2010, English abstract.
(Continued)

*Primary Examiner* — Matthew Gordon
(74) *Attorney, Agent, or Firm* — Rabin & Berdo, P.C.

(57) ABSTRACT

A semiconductor device includes a MOSFET including a PN junction diode. A unipolar device is connected in parallel to the MOSFET and has two terminals. A first wire connects the PN junction diode to one of the two terminals of the unipolar device. A second wire connects the one of the two terminals of the unipolar device to an output line, so that the output line is connected to the MOSFET and the unipolar device via the first wire and the second wire. In one embodiment the connection of the first wire to the diode is with its anode, and in another the connection is with the cathode.

12 Claims, 8 Drawing Sheets

Related U.S. Application Data continuation of application No. 15/278,555, filed on Sep. 28, 2016, now Pat. No. 9,679,677, which is a continuation of application No. 15/001,195, filed on Jan. 19, 2016, now Pat. No. 9,461,021, which is a continuation of application No. 13/700,129, filed as application No. PCT/JP2011/062233 on May 27, 2011, now Pat. No. 9,245,956.

(51) Int. Cl.

| | |
|---|---|
| H02M 7/00 | (2006.01) |
| H01L 29/16 | (2006.01) |
| H01L 23/00 | (2006.01) |
| H01L 29/24 | (2006.01) |
| H01L 29/78 | (2006.01) |
| H01L 29/861 | (2006.01) |
| H01L 29/872 | (2006.01) |
| H01L 23/31 | (2006.01) |

(52) U.S. Cl.
CPC ............ *H01L 24/46* (2013.01); *H01L 24/73* (2013.01); *H01L 29/1608* (2013.01); *H01L 29/24* (2013.01); *H01L 29/78* (2013.01); *H01L 29/8611* (2013.01); *H01L 29/872* (2013.01); *H02M 7/003* (2013.01); *H01L 24/45* (2013.01); *H01L 2224/04042* (2013.01); *H01L 2224/0603* (2013.01); *H01L 2224/06515* (2013.01); *H01L 2224/32245* (2013.01); *H01L 2224/45015* (2013.01); *H01L 2224/45124* (2013.01); *H01L 2224/45144* (2013.01); *H01L 2224/45147* (2013.01); *H01L 2224/46* (2013.01); *H01L 2224/48091* (2013.01); *H01L 2224/48137* (2013.01); *H01L 2224/48139* (2013.01); *H01L 2224/48247* (2013.01); *H01L 2224/48463* (2013.01); *H01L 2224/49112* (2013.01); *H01L 2224/73265* (2013.01); *H01L 2924/12032* (2013.01); *H01L 2924/12036* (2013.01); *H01L 2924/12041* (2013.01); *H01L 2924/13091* (2013.01); *H01L 2924/181* (2013.01)

(58) Field of Classification Search
USPC .......................................................... 257/77
See application file for complete search history.

(56) References Cited

U.S. PATENT DOCUMENTS

| | | | |
|---|---|---|---|
| 6,144,093 A | 11/2000 | Davis et al. | |
| 6,753,674 B2 | 6/2004 | Grundl et al. | |
| 7,778,054 B2 | 8/2010 | Sasaya et al. | |
| 9,917,074 B2* | 3/2018 | Okumura | H01L 25/072 |
| 2002/0093094 A1 | 7/2002 | Takagawa et al. | |
| 2003/0137320 A1 | 7/2003 | Grundl et al. | |
| 2005/0218472 A1 | 10/2005 | Okada et al. | |
| 2005/0231990 A1 | 10/2005 | Uno et al. | |
| 2006/0022298 A1 | 2/2006 | Shiraishi et al. | |
| 2006/0145298 A1 | 7/2006 | Omura | |
| 2006/0208276 A1 | 9/2006 | Sugawara | |
| 2006/0244091 A1 | 11/2006 | Kikuchi et al. | |
| 2007/0032064 A1 | 2/2007 | Behzad | |
| 2007/0170436 A1 | 7/2007 | Sugawara | |
| 2007/0278516 A1 | 12/2007 | Hashimoto et al. | |
| 2008/0054425 A1 | 3/2008 | Malhan et al. | |
| 2008/0204115 A1 | 8/2008 | Sugawara | |
| 2009/0058500 A1 | 3/2009 | Osawa et al. | |
| 2009/0168471 A1 | 7/2009 | Tsugawa et al. | |
| 2009/0206812 A1* | 8/2009 | Sasaya | H02M 3/1588 323/282 |
| 2010/0013085 A1 | 1/2010 | Oi et al. | |
| 2010/0213510 A1 | 8/2010 | Osawa et al. | |
| 2010/0309700 A1 | 12/2010 | Maeda et al. | |
| 2011/0187003 A1 | 8/2011 | Oi et al. | |
| 2011/0210713 A1 | 9/2011 | Kazama | |

FOREIGN PATENT DOCUMENTS

| | | | |
|---|---|---|---|
| JP | 2001-245479 | A | 9/2001 |
| JP | 2002-141465 | A | 5/2002 |
| JP | 2002-217416 | A | 8/2002 |
| JP | 2005-285913 | A | 10/2005 |
| JP | 2005-310907 | A | 11/2005 |
| JP | 2006-40926 | A | 2/2006 |
| JP | 2006-166562 | A | 6/2006 |
| JP | 2006-166655 | A | 6/2006 |
| JP | 2006-310790 | A | 11/2006 |
| JP | 2007-305836 | A | 11/2007 |
| JP | 2008-010851 | A | 1/2008 |
| JP | 2008-017237 | A | 1/2008 |
| JP | 2008-060529 | A | 3/2008 |
| JP | 2008-166461 | A | 7/2008 |
| JP | 2009-16507 | A | 1/2009 |
| JP | 2009-183115 | A | 8/2009 |
| JP | 2009-194954 | A | 8/2009 |
| JP | 2009-195054 | A | 8/2009 |
| JP | 2010-027814 | A | 2/2010 |
| JP | 5646034 | B2 | 12/2014 |
| WO | WO-2009/081561 | A1 | 7/2009 |

OTHER PUBLICATIONS

Kyoichi Takagawa, "Structure and Application Field of Power-MOSFET", Toranjisuta Gijyutsu, Aug. 2004, p. 139-140.
Japanese Office Action with translation dated Jul. 12, 2016.
Jorg Berkner, Klaus-Willi Pieper, "Bondwire Inductance Calculation and Measurement". Infineon Technologies 2014.
Third Party Observation on pending application EP 2579443 dated Sep. 21, 2016.

\* cited by examiner

SEMICONDUCTOR DEVICE COMPRISING PN JUNCTION DIODE AND SCHOTTKY BARRIER DIODE

CROSS-REFERENCE TO RELATED APPLICATIONS

This application is a continuation of co-pending U.S. application Ser. No. 15/609,407, filed on May 31, 2017, and allowed on Nov. 2, 2018, which is a continuation of U.S. application Ser. No. 15/278,555, filed on Sep. 28, 2016 (now U.S. Pat. No. 9,679,877, issued on Jun. 13, 2017), which is a continuation of U.S. application Ser. No. 15/001,195, filed on Jan. 19, 2016 (now U.S. Pat. No. 9,461,021, issued on Oct. 4, 2016), which is a continuation of U.S. application Ser. No. 13/700,129, filed on Nov. 26, 2012 (now U.S. Pat. No. 9,245,956, issued on Jan. 26, 2016), which is, in turn, a national stage of PCT application number PCT/JP2011/062233, filed on May 27, 2011. Furthermore, these applications claim the foreign priority benefits of Japanese application number 2010-121375, filed on May 27, 2010. The disclosures of these prior applications are incorporated herein by reference.

TECHNICAL FIELD

The present invention relates to an electronic circuit such as an inverter circuit or a converter circuit.

BACKGROUND ART

A MOSFET (Metal-Oxide-Semiconductor Field Effect Transistor) is used as a switching element of an electronic circuit, such as an inverter circuit or a converter circuit. A PN junction diode (body diode) that is a bipolar device parasitizes the MOSFET. In an electronic circuit in which the MOSFET is used, there is a fear that, if an electric current flows through the PN junction diode (body diode) parasitizing the MOSFET, device properties will be deteriorated. In detail, if an electric current flows through the PN junction diode, and if the MOSFET has a crystal defect area, there is a fear that an electron and a hole will be recombined together in the crystal defect area, and the crystal defect area will be enlarged.

Especially in an SiC MOSFET made of an SiC-based semiconducting material, if an electric current flows through a PN junction diode, a forward direction deterioration (hereinafter, referred to simply as a "forward deterioration") will be caused. In more detail, it is known that an SiC semiconductor crystal has a crystal defect that is called "BPD (Basal Plane Dislocation)." The crystal structure of a BPD part is characterized in that the band gap of its crystal is smaller than the original band gap of an SiC semiconductor, unlike the crystal structure of the other parts. Therefore, the BPD part is liable to become a recombination center of an electron and a hole. Therefore, if a forward current flows through a PN junction part, BPD will be enlarged, and will cause a stacking fault. As a result, the on-resistance of the SiC MOSFET will be increased.

Therefore, in order to prevent an electric current from flowing through the PN junction diode, a proposal has been made to provide a circuit structure in which a Schottky barrier diode whose operating voltage is lower than that of the PN junction diode is connected in parallel to the PN junction diode.

PRIOR ART DOCUMENTS

Patent Documents

Patent Document 1: Japanese Published Unexamined Patent Application No. 2006-310790

BRIEF SUMMARY OF THE INVENTION

Problems to be Solved by the Invention

However, even when such a circuit structure in which the Schottky barrier diode is connected in parallel thereto is employed, a phenomenon in which an electric current flows through a PN junction diode has occurred. The inventor of the present application has discovered that this phenomenon is caused by a parasitic inductance of a current path passing through the Schottky barrier diode. In other words, when an electric current starts flowing through the Schottky barrier diode, a counter electromotive force is generated by a parasitic inductance of a current path passing through the Schottky barrier diode. When this counter electromotive force reaches a forward voltage of the PN junction diode connected in parallel to the Schottky barrier diode, an electric current flows through the PN junction diode.

It is an object of the present invention to provide an electronic circuit capable of restraining an electric current from flowing through a bipolar device.

Means for Solving the Problems

The electronic circuit of the present invention includes a bipolar device, a unipolar device connected in parallel to the bipolar device, and an output line connected to the bipolar device and to the unipolar device. An inductance between the unipolar device and the output line is smaller than an inductance between the bipolar device and the output line.

The aforementioned or other objects, features, and effects of the present invention will be clarified by the following description of embodiments with reference to the accompanying drawings.

MODES FOR CARRYING OUT THE INVENTION

Figure 1:
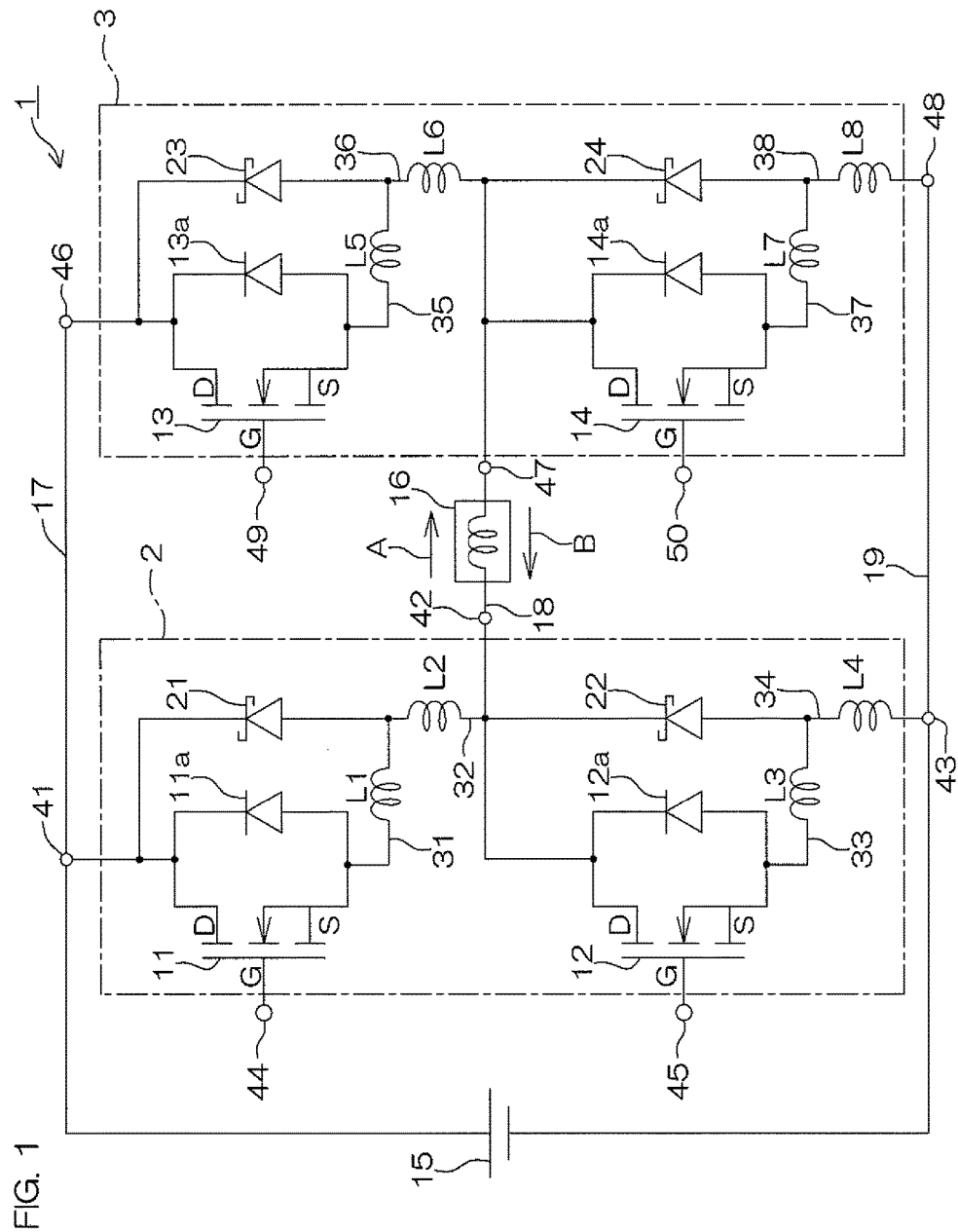
FIG. 1 is an electric circuit diagram showing an inverter circuit according to a first embodiment of the present invention.

An embodiment of the present invention provides an electronic circuit that includes a bipolar device, a unipolar device connected in parallel to the bipolar device, and an output line connected to the bipolar device and to the unipolar device. An inductance between the unipolar device and the output line is smaller than an inductance between the bipolar device and the output line. The bipolar device may be a PN junction diode. The unipolar device may be a Schottky barrier diode.

A connection mode in which the bipolar device and the output line are connected together may be either a first connection mode or a second connection mode as follows. In the first connection mode, the bipolar device is connected to the unipolar device by means of a connection line, and the unipolar device is connected to the output line by means of another connection line. In the second connection mode, the bipolar device is connected to the output line without being connected to the unipolar device. In other words, the bipolar device and the unipolar device are connected to the output line by means of each individual connection line.

In the first connection mode, there exists an inductance by the connection line between the bipolar device and the unipolar device, and there exists an inductance by the connection line between the unipolar device and the output line. Therefore, the inductance between the unipolar device and the output line is smaller than the inductance between the bipolar device and the output line. In the first connection mode, when an electric current flows through the unipolar device, a counter electromotive force is generated by the inductance between the unipolar device and the output line. However, the bipolar device is connected to the unipolar device, and therefore merely a voltage equivalent to the operating voltage of the unipolar device (i.e., equivalent to a forward voltage in a Schottky barrier diode) is applied to the bipolar device. The operating voltage of the bipolar device is lower than the operating voltage of the unipolar device, and therefore the current does not flow through the bipolar device. Therefore, a crystal defect area can be restrained from expanding even if the crystal defect area exists in the bipolar device.

Likewise, in the second connection mode, when an electric current flows through the unipolar device, a counter electromotive force is generated by an inductance by the connection line between the unipolar device and the output line. However, the inductance by the connection line between the unipolar device and the output line is smaller than the inductance between the bipolar device and the output line, and therefore the counter electromotive force generated by the smaller inductance between the unipolar device and the output line is absorbed by the greater inductance between the bipolar device and the output line. Therefore, the current does not flow through the bipolar device. Therefore, a crystal defect area can be restrained from expanding even if the crystal defect area exists in the bipolar device.

In one embodiment of the present invention, the bipolar device is an SiC semiconductor device made of a semiconducting material that chiefly includes SiC. The SiC semiconductor device has a crystal defect that is called "BPD (Basal Plane Dislocation)," and therefore, if a forward current flows through the PN junction part, BPD will expand, and a stacking fault will be caused. In this arrangement, if an electric current flows through the unipolar device, the current can be restrained from flowing through the SiC semiconductor device (i.e., PN junction part) that is a bipolar device. As a result, BPD that exists in the SiC semiconductor device can be restrained from expanding.

In one embodiment of the present invention, a counter electromotive force generated by the inductance between the unipolar device and the output line is 2.0 V or more. It is conceivable that the operating voltage of the bipolar device (for example, the forward voltage of the PN junction diode) is about 2.0 V. Therefore, if the counter electromotive force generated by the inductance between the unipolar device and the output line is less than 2.0 V, an electric current does not flow through the bipolar device in actual fact. Therefore, if the electromotive force generated by the inductance between the unipolar device and the output line is 2.0 V or more, a substantial effect of the present invention can be obtained.

In one embodiment of the present invention, the bipolar device includes a PN junction diode, and the unipolar device includes a Schottky barrier diode.

When an electric current flows through the Schottky barrier diode, a counter electromotive force is generated by an inductance between the Schottky barrier diode and the output line. In the first connection mode mentioned above, the PN junction diode is connected to the Schottky barrier diode, and therefore only a voltage equivalent to the forward voltage of the Schottky barrier diode is applied to the PN junction diode. The forward voltage of the PN junction diode is lower than the forward voltage of the Schottky barrier diode, and therefore the current does not flow through the PN junction diode.

In the second connection mode, the inductance between the Schottky barrier diode and the output line is smaller than the inductance between the PN junction diode and the output line. Therefore, a counter electromotive force generated by the inductance between the Schottky barrier diode and the output line is absorbed by the inductance between the PN junction diode and the output line. Therefore, the current does not flow through the PN junction diode.

In one embodiment of the present invention, the electronic circuit further includes a connection metal member through which an anode of the PN junction diode is connected to an anode of the Schottky barrier diode and that is parasitized by an inductance, and the anode of the Schottky barrier diode is connected to the output line. The connection metal member may be a wire, a ribbon, or a frame.

When an electric current flows through the Schottky barrier diode, a counter electromotive force is generated by an inductance between the Schottky barrier diode and the output line. However, the anode of the PN junction diode is connected to the anode of the Schottky barrier diode by means of the connection metal member, and therefore only a voltage equivalent to the forward voltage of the Schottky barrier diode is applied to the PN junction diode. The forward voltage of the Schottky barrier diode is lower than the forward voltage of the PN junction diode, and therefore the current does not flow through the PN junction diode.

In one embodiment of the present invention, the electronic circuit further includes a connection metal member through which a cathode of the PN junction diode is connected to a cathode of the Schottky barrier diode and that is parasitized by an inductance, and the cathode of the Schottky barrier diode is connected to the output line.

When an electric current flows through the Schottky barrier diode, a counter electromotive force is generated by an inductance between the Schottky barrier diode and the output line. However, the cathode of the PN junction diode is connected to the cathode of the Schottky barrier diode by means of the connection metal member, and therefore only a voltage equivalent to the forward voltage of the Schottky barrier diode is applied to the PN junction diode. The forward voltage of the Schottky barrier diode is lower than the forward voltage of the PN junction diode, and therefore the current does not flow through the PN junction diode.

In one embodiment of the present invention, the PN junction diode is connected in inverse parallel to a switching device.

In one embodiment of the present invention, the switching device is a MOSFET, and the PN junction diode is built in the MOSFET. In this arrangement, an electric current can be restrained from flowing through the PN junction diode built in the MOSFET, and therefore a forward direction deterioration of the MOSFET can be prevented.

In one embodiment of the present invention, the electronic circuit further includes a connection metal member through which a source of the MOSFET is connected to the anode of the Schottky barrier diode and that is parasitized by an inductance, and the anode of the Schottky barrier diode is connected to the output line.

When an electric current flows through the Schottky barrier diode, a counter electromotive force is generated by an inductance between the Schottky barrier diode and the output line. However, the source of the MOSFET is connected to the anode of the Schottky barrier diode by means of the connection metal member, and therefore only a voltage equivalent to the operating voltage of the Schottky barrier diode is applied to the PN junction diode built in the MOSFET. The forward voltage of the Schottky barrier diode is lower than the forward voltage of the PN junction diode, and therefore the current does not flow through the PN junction diode. Therefore, a forward direction deterioration of the MOSFET can be prevented.

The electronic circuit may further include a connection metal member through which the anode of the Schottky barrier diode is connected to the output line and that is parasitized by an inductance. Additionally, the connection metal member through which the source of the MOSFET is connected to the anode of the Schottky barrier diode and the connection metal member through which the anode of the Schottky barrier diode is connected to the output line may be continuously connected together.

In one embodiment of the present invention, the electronic circuit further includes a connection metal member through which a drain of the MOSFET is connected to the cathode of the Schottky barrier diode and that is parasitized by an inductance, and the cathode of the Schottky barrier diode is connected to the output line.

When an electric current flows through the Schottky barrier diode, a counter electromotive force is generated by an inductance between the Schottky barrier diode and the output line. However, the drain of the MOSFET is connected to the cathode of the Schottky barrier diode by means of the connection metal member, and therefore only a voltage equivalent to the forward voltage of the Schottky barrier diode is applied to the PN junction diode built in the MOSFET. The forward voltage of the Schottky barrier diode is lower than the forward voltage of the PN junction diode, and therefore the current does not flow through the PN junction diode. Therefore, a forward direction deterioration of the MOSFET can be prevented.

In one embodiment of the present invention, the connection metal member includes a wire. A ribbon and a frame can be mentioned as other examples of the connection metal member. The wire is a linear connection member, and the ribbon is a belt-like connection member. Generally, these members are metallic members that are flexible. The frame is a plate-like metallic member that is less flexible.

Embodiments of the present invention will be hereinafter described in detail with reference to the accompanying drawings.

FIG. 1 is an electric circuit diagram showing an inverter circuit 1 according to a first embodiment of the present invention.

The inverter circuit 1 includes a first module 2 and a second module 3. The first module 2 is composed of a first power source terminal 41, a second power source terminal 43, two gate terminals 44 and 45, and an output terminal 42. The second module 3 is composed of a first power source terminal 46, a second power source terminal 48, two gate terminals 49 and 50, and an output terminal 47. The first power source terminals 41 and 46 of the modules 2 and 3 are connected to a positive electrode terminal of a power source (DC power source) 15 through a first output line 17. An inductive load 16 is disposed between the output terminals 42 and 47 of the modules 2 and 3, and is connected to the output terminals 42 and 47 through a second output line 18. The second power source terminals 43 and 48 of the modules 2 and 3 are connected to a negative electrode terminal of the power source 15 through a third output line 19. A control unit (not shown) is connected to the gate terminals 44, 45, and 49, 50 of the modules 2 and 3, respectively.

The first module 2 includes a first high-side MOSFET 11 and a second low-side MOSFET 12 that is connected in series to the first MOSFET 11. The MOSFETs 11 and 12 have a first PN junction diode (body diode) 11a built in and a second PN junction diode 12a built in, respectively. Each of these PN junction diodes 11a and 12a is a bipolar device. An anode of each of the PN junction diodes 11a and 12a is electrically connected to a corresponding source of each of the MOSFETs 11 and 12, whereas a cathode thereof is electrically connected to a corresponding drain of each of the MOSFETs 11 and 12.

A first Schottky barrier diode 21 that is a unipolar device and a second Schottky barrier diode 22 that is a unipolar device are connected in parallel to the MOSFETs 11 and 12, respectively. In other words, Schottky barrier diodes 21 and 22 each of which is a unipolar device are connected in parallel to the PN junction diodes 11a and 12a each of which is a bipolar device.

The drain of the first MOSFET 11 is connected to the first power source terminal 41 of the first module 2. The cathode of the first Schottky barrier diode 21 is connected to the drain of the first MOSFET 11 (i.e., to the cathode of the first PN junction diode 11a). The source of the first MOSFET (i.e., the anode of the first PN junction diode 11a) is connected to the anode of the first Schottky barrier diode 21 through a connection metal member 31. The anode of the first Schottky barrier diode 21 is connected to the output terminal 42 of the first module 2 through another connection metal member 32. In other words, the anode of the first Schottky barrier diode 21 is connected to the second output line 18 through the connection metal member 32.

Inductances L1 and L2 (L1>0, L2>0) parasitize the connection metal members 31 and 32, respectively. Therefore, the inductance (L1+L2) between the first PN junction diode 11a and the second output line 18 is greater than the inductance L2 between the first Schottky barrier diode 21 and the second output line 18.

The drain of the second MOSFET 12 is connected to the output terminal 42 of the first module 2. The cathode of the second Schottky barrier diode 22 is connected to the drain of the second MOSFET 12 (i.e., to the cathode of the second PN junction diode 12a). The source of the second MOSFET 12 (i.e., the anode of the second PN junction diode 12a) is connected to the anode of the second Schottky barrier diode 22 through the connection metal member 33. The anode of the second Schottky barrier diode 22 is connected to the second power source terminal 43 of the first module 2 through the connection metal member 34. In other words, the anode of the second Schottky barrier diode 22 is connected to the third output line 19 through the connection metal member 34.

Inductances L3 and L4 (L3>0, L4>0) parasitize the connection metal members 33 and 34, respectively. Therefore, the inductance (L3+L4) between the second PN junction diode 12a and the third output line 19 is greater than the inductance L4 between the second Schottky barrier diode 22 and the third output line 19.

The second module 3 includes a third high-side MOSFET 13 and a fourth low-side MOSFET 14 that is connected in series to the third MOSFET 13. The MOSFETs 13 and 14 have third and fourth PN junction diodes 13a and 14a (body diodes) built in, respectively. Each of these PN junction diodes 13a and 14a is a bipolar device. An anode of each of the PN junction diodes 13a and 14a is electrically connected to a corresponding source of each of the MOSFETs 13 and 14, whereas a cathode thereof is electrically connected to a corresponding drain of each of the MOSFETs 13 and 14.

Third and fourth Schottky barrier diodes 23 and 24 are connected in parallel to the MOSFETs 13 and 14, respectively. In other words, Schottky barrier diodes 23 and 24 each of which is a unipolar device are connected in parallel to the PN junction diodes 13a and 14a each of which is a bipolar device.

The drain of the third MOSFET 13 is connected to the first power source terminal 46 of the second module 3. The cathode of the third Schottky barrier diode 23 is connected to the drain of the third MOSFET 13 (i.e., to the cathode of the third PN junction diode 13a). The source of the third MOSFET 13 (i.e., the anode of the third PN junction diode 13a) is connected to the anode of the third Schottky barrier diode 23 through a connection metal member 35. The anode of the third Schottky barrier diode 23 is connected to the output terminal 47 of the second module 3 through another connection metal member 36. In other words, the anode of the third Schottky barrier diode 23 is connected to the second output line 18 through the connection metal member 36.

Inductances L5 and L6 (L5>0, L6>0) parasitize the connection metal members 35 and 36, respectively. Therefore, the inductance (L5+L6) between the third PN junction diode 13a and the second output line 18 is greater than the inductance L6 between the third Schottky barrier diode 23 and the second output line 18.

The drain of the fourth MOSFET 14 is connected to the output terminal 47 of the second module 3. The cathode of the fourth Schottky barrier diode 24 is connected to the drain of the fourth MOSFET 14 (i.e., to the cathode of the fourth PN junction diode 14a). The source of the fourth MOSFET 14 (i.e., the anode of the fourth PN junction diode 14a) is connected to the anode of the fourth Schottky barrier diode 24 through the connection metal member 37. The anode of the fourth Schottky barrier diode 24 is connected to the second power source terminal 48 of the second module 3 through the connection metal member 38. In other words, the anode of the fourth Schottky barrier diode 24 is connected to the third output line 19 through the connection metal member 38.

Inductances L7 and L8 (L7>0, L8>0) parasitize the connection metal members 37 and 38, respectively. Therefore, the inductance (L7+L8) between the fourth PN junction diode 14a and the third output line 19 is greater than the inductance L8 between the fourth Schottky barrier diode 24 and the third output line 19.

Each of the first to fourth MOSFETs 11 to 14 is, for example, an SiC device in which SiC (silicon carbide) that is an example of a compound semiconductor is used as a semiconducting material. The forward voltage Vf1 of each of the Schottky barrier diodes 21 to 24 is lower than the forward voltage Vf2 of each of the PN junction diodes 11a to 14a. The forward voltage Vf2 of each of the PN junction diodes 11a to 14a is, for example, 2.0 V. On the other hand, the forward voltage Vf1 of each of the Schottky barrier diodes 21 to 24 is, for example, 1.0 V.

Figure 2:
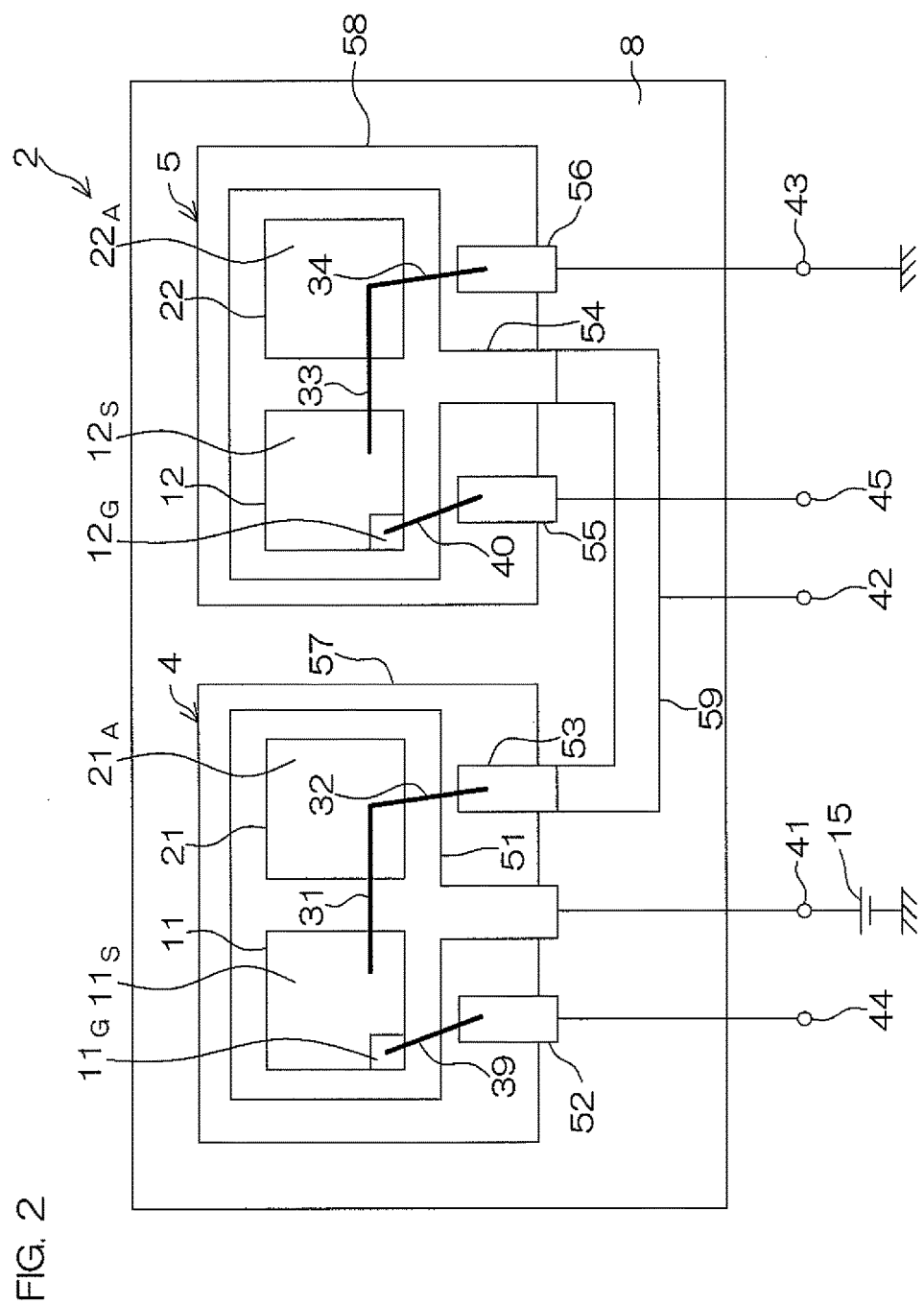
FIG. 2 is a schematic plan view showing an internal structure of a module of FIG. 1.
Figure 3:
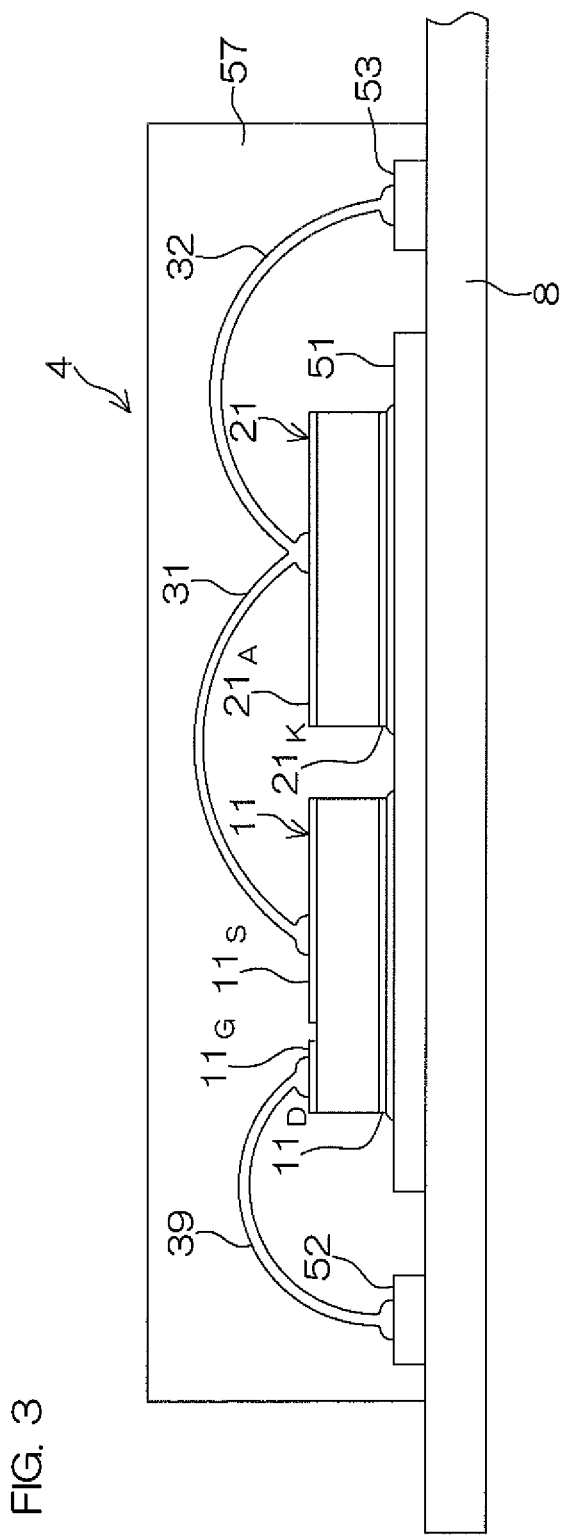
FIG. 3 is a schematic side view showing an internal structure of a package of FIG. 2.

FIG. 2 is a schematic plan view showing an internal structure of the module 2 of FIG. 1. FIG. 3 is a schematic side view showing an internal structure of a package 4 of FIG. 2.

The module 2 includes an insulating substrate 8, two packages 4 and 5 fixed onto the insulating substrate 8, and a case (not shown) that is fixed to one surface of the insulating substrate 8 and that contains the two packages 4 and 5. The insulating substrate 8 has the shape of a rectangle when viewed planarly. Each of the packages 4 and 5 is formed in a substantially rectangular shape when viewed planarly. The two packages 4 and 5 are arranged side by side in the longitudinal direction of the insulating substrate 8.

Referring to FIG. 2 and FIG. 3, the package 4 includes a die pad 51, a gate lead 52, a source lead 53, the first MOSFET 11, the first Schottky barrier diode 21, and a molding resin 57 by which these components are sealed up. The die pad 51 has the shape of the capital letter T when viewed planarly, and has a rectangular body part and a lead part that protrudes substantially from the center of one side of the body part. A forward end of the lead part protrudes from the molding resin 57. The gate lead 52 and the source lead 53 are disposed in parallel with the lead part of the die pad 51 with the lead part of the die pad 51 therebetween. An end of each of the gate lead 52 and the source lead 53 protrudes from the molding resin 57. Each of the die pad 51, the gate lead 52, and the source lead 53 has the shape of a plate made of, for example, copper or aluminum.

The first MOSFET 11 and the first Schottky barrier diode 21 are arranged side by side on a surface of the body part of the die pad 51 along one side of the body part. The first MOSFET 11 and the first Schottky barrier diode 21 are mounted on one surface of the die pad 51 by die bonding. The first MOSFET 11 has a drain electrode $11_D$ on its surface that faces the die pad, and this drain electrode $11_D$ is joined to the die pad 51 by means of a conductive solder material. The first MOSFET 11 has a source electrode $11_S$ and a gate electrode $11_G$ on its surface that is on the side opposite to the die pad 51.

The first Schottky barrier diode 21 has a cathode electrode $21_K$ on its surface that faces the die pad 51, and this cathode electrode $21_K$ is joined to the die pad 51 by means of a conductive solder material. The first Schottky barrier diode 21 has an anode electrode $21_A$ on its surface that is on the side opposite to the die pad 51.

The gate electrode $11_G$ of the first MOSFET 11 is electrically connected to the gate lead 52 by means of a bonding wire (i.e., a connection metal member) 39. The source electrode $11_S$ of the first MOSFET 11 is electrically connected to the anode electrode $21_A$ of the first Schottky barrier diode 21 by means of the bonding wire (i.e., the connection metal member) 31. The anode electrode $21_A$ of the first Schottky barrier diode 21 is electrically connected to the source lead 53 by means of the bonding wire (i.e., the connection metal member) 32.

Wire bonding in which the source electrode $11_S$ of the first MOSFET 11 is connected to the anode electrode $21_A$ of the first Schottky barrier diode 21 and wire bonding in which the anode electrode $21_A$ of the first Schottky barrier diode 21 is connected to the source lead 53 may be performed according to a stitch bonding method. In other words, it is permissible to perform the connection of the components to each other according to stitch bonding in which either one of the source lead 53 and the source electrode $11_S$ of the first MOSFET 11 is used as a starting point, and the remaining one thereof is used as a terminal point, and the anode electrode $21_A$ of the first Schottky barrier diode 21 is used as a relay point. The bonding wires 31, 32, and 39 are wires made chiefly of, for example, Al, Au, or Cu.

Referring to FIG. 2, the other package 5 includes a die pad 54, a gate lead 55, a source lead 56, the second MOSFET 12, the second Schottky barrier diode 22, and a molding resin 58 by which these components are sealed up. The die pad 54 has the shape of the capital letter T when viewed planarly, and has a rectangular body part and a lead part that protrudes substantially from the center of one side of the body part. A forward end of the lead part protrudes from the molding resin 58. The gate lead 55 and the source lead 56 are disposed in parallel with the lead part of the die pad 54 with the lead part of the die pad 54 therebetween. An end of each of the gate lead 55 and the source lead 56 protrudes from the molding resin 58. Each of the die pad 54, the gate lead 55, and the source lead 56 has the shape of a plate made of, for example, copper or aluminum.

The second MOSFET 12 and the second Schottky barrier diode 22 are arranged side by side on a surface of the body part of the die pad 54 along one side of the body part. The second MOSFET 12 and the second Schottky barrier diode 22 are mounted on one surface of the die pad 54 by die bonding. The second MOSFET 12 has a drain electrode on its surface that faces the die pad 54, and this drain electrode is joined to the die pad 54 by means of a conductive solder material. The second MOSFET 12 has a source electrode $12_S$ and a gate electrode $12_G$ on its surface that is on the side opposite to the die pad 54.

The second Schottky barrier diode 22 has a cathode electrode on its surface that faces the die pad 54, and this cathode electrode is joined to the die pad 54 by means of a conductive solder material. The second Schottky barrier diode 22 has an anode electrode $22_A$ on its surface that is on the side opposite to the die pad 54.

The gate electrode $12_G$ of the second MOSFET 12 is electrically connected to the gate lead 55 by means of a bonding wire (i.e., a connection metal member) 40. The source electrode $12_S$ of the second MOSFET 12 is electrically connected to the anode electrode $22_A$ of the second Schottky barrier diode 22 by means of the bonding wire (i.e., the connection metal member) 33. The anode electrode $22_A$ of the second Schottky barrier diode 22 is electrically connected to the source lead 56 by means of the bonding wire (i.e., the connection metal member) 34.

Wire bonding in which the source electrode $12_S$ of the second MOSFET 12 is connected to the anode electrode $22_A$ of the second Schottky barrier diode 22 and wire bonding in which the anode electrode $22_A$ of the second Schottky barrier diode 22 is connected to the source lead 56 may be performed according to a stitch bonding method. In other words, it is permissible to perform the connection of the components to each other according to stitch bonding in which either one of the source lead 56 and the source electrode $12_S$ of the second MOSFET 11 is used as a starting point, and the remaining one thereof is used as a terminal point, and the anode electrode $22_A$ of the second Schottky barrier diode 22 is used as a relay point. The bonding wires 33, 34, and 40 are wires made chiefly of, for example, Al, Au, or Cu.

The source lead 56 of the package 4 and the lead part of the die pad 54 of the package 5 are electrically connected together by means of a belt-like metallic pattern 59 having the shape of the capital letter U when viewed planarly. The metallic pattern 59 is a thin film wire made of, for example, copper or aluminum, and is formed on a surface of the insulating substrate 8.

The gate lead 52 of the package 4 is connected to the gate terminal 44. The gate terminal 44 is drawn out of the case of the module 2. The lead part of the die pad 51 of the package 4 is connected to the first power source terminal 41. The first power source terminal 41 is drawn out of the case of the module 2. The power source 15 is connected to the first power source terminal 41. The metallic pattern 59 is connected to the output terminal 42. The output terminal 42 is drawn out of the case of the module 2.

The gate lead 55 of the package 5 is connected to the gate terminal 45. The gate terminal 45 is drawn out of the case of the module 2. The source lead 56 of the package 5 is connected to the second power source terminal 43. The second power source terminal 43 is drawn out of the case of the module 2. The second power source terminal 43 is grounded (i.e., is connected to a negative electrode of the power source 15).

The internal structure of the second module 3 is the same as the internal structure of the first module 2, and therefore a description of its structure is omitted.

Referring back to FIG. 1, in the thus formed inverter circuit 1, the first MOSFET 11 and the fourth MOSFET 14 are turned on, for example. Thereafter, the MOSFETs 11 and 14 are turned off, and, as a result, all of the MOSFETs 11 to 14 are brought into an OFF state. When a predetermined dead time period elapses, the second MOSFET 12 and the third MOSFET 13 are, this time, turned on. Thereafter, the MOSFETs 12 and 13 are turned off, and, as a result, all of the MOSFETs 11 to 14 are brought into an OFF state. When a predetermined dead time period elapses, the first MOSFET 11 and the fourth MOSFET 14 are turned on again. This operation is repeatedly performed, and, as a result, the load 16 is driven in an AC manner.

When the first MOSFET 11 and the fourth MOSFET 14 are turned on, an electric current flows from a positive electrode of the power source 15 toward the third output line 19 through the first output line 17, the first MOSFET 11, the connection metal member 31, the connection metal member 32, the second output line 18, the load 16, the second output line 18, the fourth MOSFET 14, the connection metal member 37, and the connection metal member 38. In this case, the current flows through the load 16 in a direction shown by arrow "A."

When all of the MOSFETs 11 to 14 are brought into an OFF state from this state, the inductance of the inductive load 16 attempts to maintain an electric current flowing through the load 16 (i.e., maintain the current flowing in the direction shown by arrow "A"). Therefore, the current flows through the connection metal wire 34, the second Schottky barrier diode 22, the load 16, the connection metal wire 36, and the third Schottky barrier diode 23 in the direction from the connection metal wire 34 toward the third Schottky barrier diode 23. As a result, the current flows through the connection metal wire 34 and the connection metal wire 36.

When the current flows through the connection metal wire 34, a counter electromotive force is generated by an inductance L4 parasitizing this metal wire. However, the voltage of this counter electromotive force is not applied to the second PN junction diode 12a. The reason is that the anode of the second PN junction diode 12a is connected to the anode of the second Schottky barrier diode 22 by means of the connection metal wire 33. Only a voltage equivalent to the forward voltage Vf1 of the second Schottky barrier diode 22 is applied to the second PN junction diode 12a. In other words, the second PN junction diode 12a does not receive a voltage greater than its forward voltage Vf2. Therefore, the current does not flow through the second PN junction diode 12a.

Likewise, when an electric current flows through the connection metal wire 36, a counter electromotive force is generated by an inductance L6 parasitizing this metal wire. However, the voltage of this counter electromotive force is not applied to the third PN junction diode 13a. The reason is that the anode of the third PN junction diode 13a is connected to the anode of the third Schottky barrier diode 23 by means of the connection metal wire 35. Only a voltage equivalent to the forward voltage Vf1 of the third Schottky barrier diode 23 is applied to the third PN junction diode 13a. In other words, the third PN junction diode 13a does not receive a voltage greater than its forward voltage Vf2. Therefore, the current does not flow through the third PN junction diode 13a.

When the second MOSFET 12 and the third MOSFET 13 are turned on, an electric current flows from the positive electrode of the power source 15 toward the third output line 19 through the first output line 17, the third MOSFET 13, the connection metal member 35, the connection metal member 36, the second output line 18, the load 16, the second output line 18, the second MOSFET 12, the connection metal member 33, and the connection metal member 34. In this case, the current flows through the load 16 in a direction shown by arrow B.

When all of the MOSFETs 11 to 14 are brought into an OFF state in this state, the inductance of the inductive load 16 attempts to maintain an electric current flowing through the load 16 (i.e., maintain the current flowing in the direction shown by arrow B). Therefore, the current flows through the connection metal wire 38, the fourth Schottky barrier diode 24, the load 16, the connection metal wire 32, and the first Schottky barrier diode 21 in the direction from the connection metal wire 38 toward the first Schottky barrier diode 21. As a result, the current flows through the connection metal wire 38 and the connection metal wire 32.

When the current flows through the connection metal wire 38, an electromotive force is generated by an inductance L8 parasitizing this metal wire. However, the voltage of this counter electromotive force is not applied to the fourth PN junction diode 14a. The reason is that the anode of the fourth PN junction diode 14a is connected to the anode of the fourth Schottky barrier diode 24 by means of the connection metal wire 37. Only a voltage equivalent to the forward voltage Vf1 of the fourth Schottky barrier diode 24 is applied to the fourth PN junction diode 14a. In other words, the fourth PN junction diode 14a does not receive a voltage greater than its forward voltage Vf2. Therefore, the current does not flow through the fourth PN junction diode 14a.

Likewise, when the current flows through the connection metal wire 32, an electromotive force is generated by an inductance L2 parasitizing this metal wire. However, the voltage of this counter electromotive force is not applied to the first PN junction diode 11a. The reason is that the anode of the first PN junction diode 11a is connected to the anode of the first Schottky barrier diode 21 by means of the connection metal wire 31. Only a voltage equivalent to the forward voltage Vf1 of the first Schottky barrier diode 21 is applied to the first PN junction diode 11a. In other words, the first PN junction diode 11a does not receive a voltage greater than its forward voltage Vf2. Therefore, the current does not flow through the first PN junction diode 11a.

As described above, in the first embodiment, an electric current can be restrained from flowing through the PN junction diodes 11a to 14a built in the MOSFETs 11 to 14, respectively, during a dead time period. Therefore, a forward direction deterioration of the MOSFETs 11 to 14 can be prevented.

Figure 4:
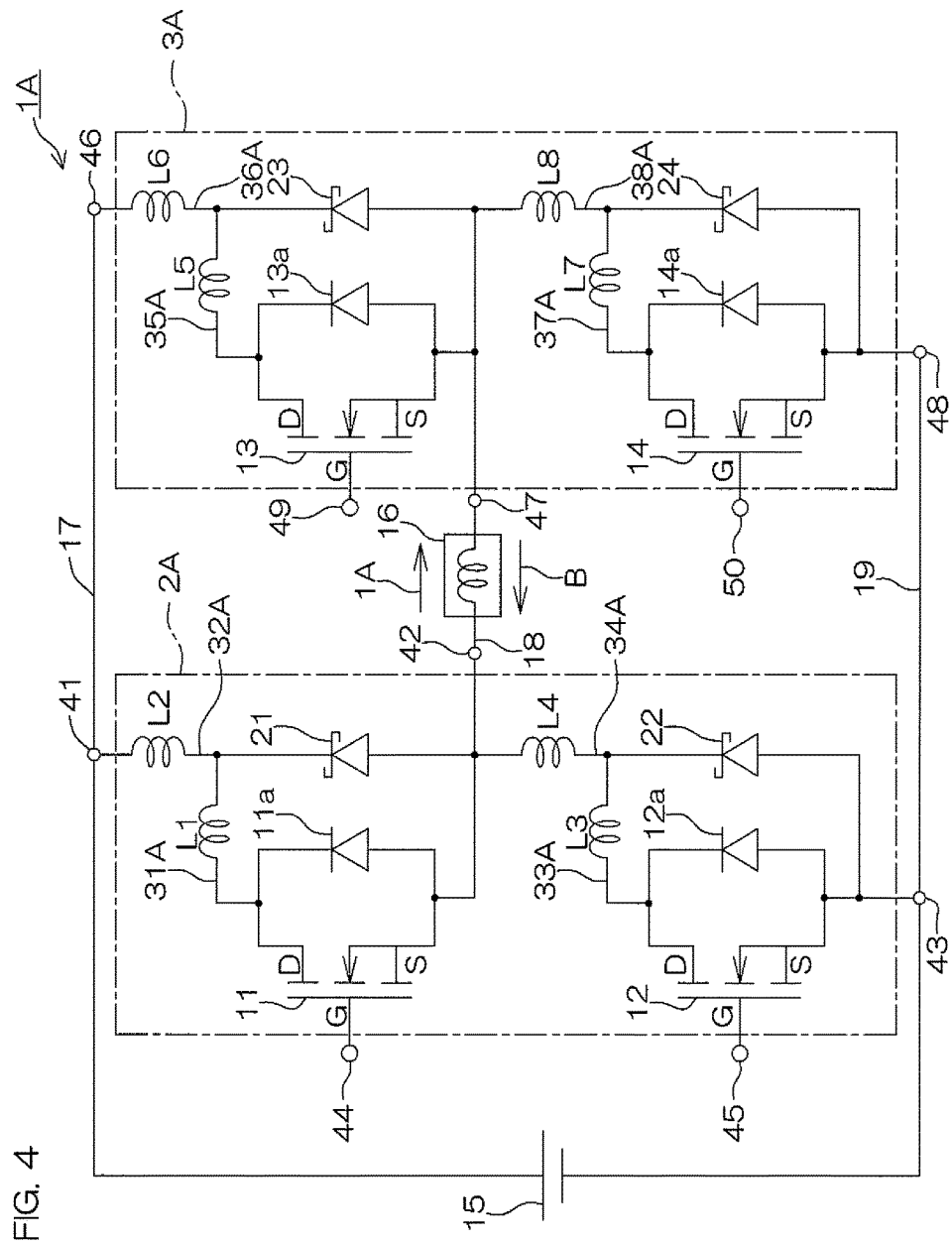
FIG. 4 is an electric circuit diagram showing an inverter circuit according to a second embodiment of the present invention.

FIG. 4 is an electric circuit diagram showing an inverter circuit 1A according to a second embodiment of the present invention. In FIG. 4, the same reference numeral as in FIG. 1 is given to a component corresponding to each component shown in FIG. 1.

In the first embodiment mentioned above, the drain electrode of each of the MOSFETs 11 to 14 and the cathode electrode of each of the Schottky barrier diodes 21 to 24 are joined to the die pad in each package as in the package 4 of FIG. 3. On the other hand, in the second embodiment, the source electrode of each of the MOSFETs 11 to 14 and the anode electrode of each of the Schottky barrier diodes 21 to 24 are joined to the die pad in each package. Therefore, in each package, the drain electrode is formed on a surface of each of the MOSFETs 11 to 14 that is on the side opposite to the die pad, and the cathode electrode is formed on a surface of each of the Schottky barrier diodes 21 to 24 that is on the side opposite to the die pad.

Referring to FIG. 4, the source of the first MOSFET 11 (i.e., the anode of the first PN junction diode 11a) and the anode of the first Schottky barrier diode 21 are connected to an output terminal 42 of a first module 2A. The drain of the first MOSFET 11 (i.e., the cathode of the first PN junction diode 11a) is connected to the cathode of the first Schottky barrier diode 21 by means of a connection metal member 31A parasitized by an inductance L1. The cathode of the first Schottky barrier diode 21 is connected to a first power source terminal 41 of the first module 2A by means of a connection metal member 32A parasitized by an inductance L2. In other words, the cathode of the first Schottky barrier diode 21 is connected to the first output line 17 through the connection metal member 32A parasitized by the inductance L2.

The source of the second MOSFET 12 (i.e., the anode of the second PN junction diode 12a) and the anode of the second Schottky barrier diode 22 are connected to a second power source terminal 43 of the first module 2A. The drain of the second MOSFET 12 (i.e., the cathode of the second PN junction diode 12a) is connected to the cathode of the second Schottky barrier diode 22 by means of a connection metal member 33A parasitized by an inductance L3. The cathode of the second Schottky barrier diode 22 is connected to the output terminal 42 of the first module 2A by means of a connection metal member 34A parasitized by an inductance L4. In other words, the cathode of the second Schottky barrier diode 22 is connected to the second output line 18 through the connection metal member 34A parasitized by the inductance L4.

The source of the third MOSFET 13 (i.e., the anode of the third PN junction diode 13a) and the anode of the third Schottky barrier diode 23 are connected to an output terminal 47 of a second module 3A. The drain of the third MOSFET 13 (i.e., the cathode of the third PN junction diode 13a) is connected to the cathode of the third Schottky barrier diode 23 by means of a connection metal member 35A parasitized by an inductance L5. The cathode of the third Schottky barrier diode 23 is connected to a first power source terminal 46 of the second module 3A by means of a connection metal member 36A parasitized by an inductance L6. In other words, the cathode of the third Schottky barrier diode 23 is connected to the first output line 17 through the connection metal member 36A parasitized by the inductance L6.

The source of the fourth MOSFET 14 (i.e., the anode of the fourth PN junction diode 14a) and the anode of the fourth Schottky barrier diode 24 are connected to a second power source terminal 48 of the second module 3A. The drain of the fourth MOSFET 14 (i.e., the cathode of the fourth PN junction diode 14a) is connected to the cathode of the fourth Schottky barrier diode 24 by means of a connection metal member 37A parasitized by an inductance L7. The cathode of the fourth Schottky barrier diode 24 is connected to the output terminal 47 of the second module 3A by means of a connection metal member 38A parasitized by an inductance L8. In other words, the cathode of the fourth Schottky barrier diode 24 is connected to the second output line 18 through the connection metal member 38A parasitized by the inductance L8.

Although the reference numeral that designates the inductance is, for convenience, set to be the same as that of the first embodiment, this does not mean that the inductances of the connection metal members 31A to 38A are respectively equal to the inductances of the connection metal members 31 to 38 mentioned in the first embodiment.

When the first MOSFET 11 and the fourth MOSFET 14 are turned on, an electric current flows from the positive electrode of the power source 15 toward the third output line 19 through the first output line 17, the connection metal member 32A, the connection metal member 31A, the first MOSFET 11, the second output line 18, the load 16, the second output line 18, the connection metal member 38A, the connection metal member 37A, and the fourth MOSFET 14. In this case, the current flows through the load 16 in the direction shown by arrow "A."

When all of the MOSFETs 11 to 14 are brought into an OFF state from this state, the inductance of the inductive load 16 maintains an electric current flowing through the load 16 (i.e., maintains the current flowing in the direction shown by arrow "A"). Therefore, the current flows through the second Schottky barrier diode 22, the connection metal wire 34A, the load 16, the third Schottky barrier diode 23, and the connection metal wire 36A in the direction from the second Schottky barrier diode 22 toward the connection metal wire 36A. As a result, the current flows through the connection metal wire 34A and the connection metal wire 36A.

When the current flows through the connection metal wire 34A, a counter electromotive force is generated by the inductance L4 parasitizing this metal wire. However, the voltage of this counter electromotive force is not applied to the second PN junction diode 12a. The reason is that the cathode of the second PN junction diode 12a is connected to the cathode of the second Schottky barrier diode 22 by means of the connection metal wire 33A. Only a voltage equivalent to the forward voltage Vf1 of the second Schottky barrier diode 22 is applied to the second PN junction diode 12a. In other words, the second PN junction diode 12a does not receive a voltage greater than its forward voltage Vf2. Therefore, the current does not flow through the second PN junction diode 12a.

Likewise, when an electric current flows through the connection metal wire 36A, a counter electromotive force is generated by the inductance L6 parasitizing this metal wire. However, the voltage of this counter electromotive force is not applied to the third PN junction diode 13a. The reason is that the cathode of the third PN junction diode 13a is connected to the cathode of the third Schottky barrier diode 23 by means of the connection metal wire 35A. Only a voltage equivalent to the forward voltage Vf1 of the third Schottky barrier diode 23 is applied to the third PN junction diode 13a. In other words, the third PN junction diode 13a does not receive a voltage greater than its forward voltage Vf2. Therefore, the current does not flow through the third PN junction diode 13a.

When the second MOSFET 12 and the third MOSFET 13 are turned on, an electric current flows from the positive electrode of the power source 15 toward the third output line 19 through the first output line 17, the connection metal member 36A, the connection metal member 35A, the third MOSFET 13, the second output line 18, the load 16, the second output line 18, the connection metal member 34A, the connection metal member 33A, and the second MOSFET 12. In this case, the current flows through the load 16 in the direction shown by arrow B.

When all of the MOSFETs 11 to 14 are brought into an OFF state in this state, the inductance of the inductive load 16 maintains an electric current flowing through the load 16 (i.e., maintains the current flowing in the direction shown by arrow B). Therefore, the current flows through the fourth Schottky barrier diode 24, the connection metal wire 38A, the load 16, the first Schottky barrier diode 21, and the connection metal wire 32A in the direction from the fourth Schottky barrier diode 24 toward the connection metal wire 32A. As a result, the current flows through the connection metal wire 38A and the connection metal wire 32A.

When the current flows through the connection metal wire 38A, a counter electromotive force is generated by the inductance L8 parasitizing this metal wire. However, the voltage of this counter electromotive force is not applied to the fourth PN junction diode 14a. The reason is that the cathode of the fourth PN junction diode 14a is connected to the cathode of the fourth Schottky barrier diode 24 by means of the connection metal wire 37A. Only a voltage equivalent to the forward voltage Vf1 of the fourth Schottky barrier diode 24 is applied to the fourth PN junction diode 14a. In other words, the fourth PN junction diode 14a does not receive a voltage greater than its forward voltage Vf2. Therefore, the current does not flow through the fourth PN junction diode 14a.

Likewise, when the current flows through the connection metal wire 32A, a counter electromotive force is generated by the inductance L2 parasitizing this metal wire. However, the voltage of this counter electromotive force is not applied to the first PN junction diode 11a. The reason is that the cathode of the first PN junction diode 11a is connected to the cathode of the first Schottky barrier diode 21 by means of the connection metal wire 31A. Only a voltage equivalent to the forward voltage Vf1 of the first Schottky barrier diode 21 is applied to the first PN junction diode 11a. In other words, the first PN junction diode 11a does not receive a voltage greater than its forward voltage Vf2. Therefore, the current does not flow through the first PN junction diode 11a.

As described above, in the second embodiment, an electric current can be restrained from flowing through the PN junction diodes 11a to 14a built in the MOSFETs 11 to 14, respectively, during a dead time period in the same way as in the first embodiment. Therefore, a forward direction deterioration of the MOSFETs 11 to 14 can be prevented.

Figure 5:
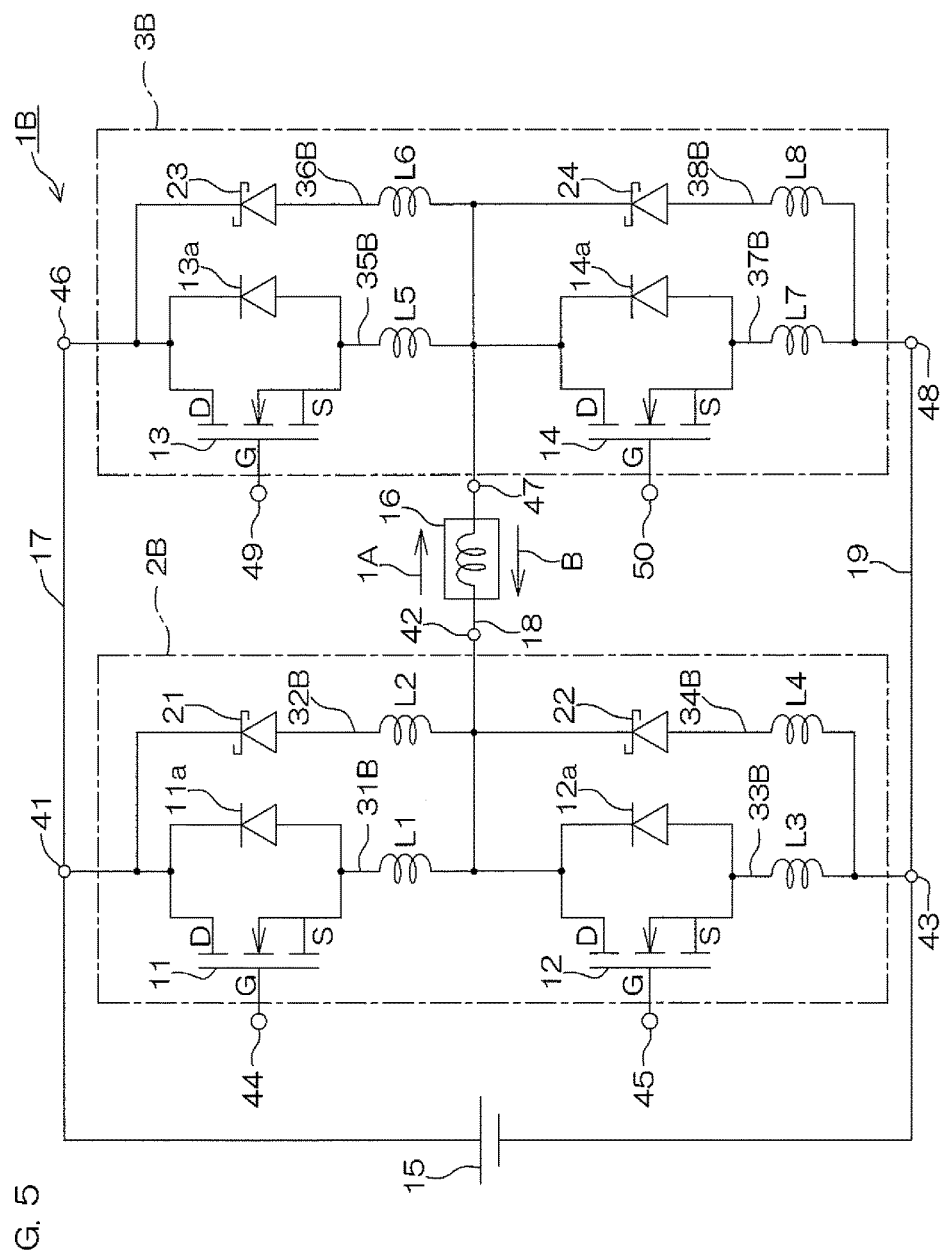
FIG. 5 is an electric circuit diagram showing an inverter circuit according to a third embodiment of the present invention.

FIG. 5 is an electric circuit diagram showing an inverter circuit 1B according to a third embodiment of the present invention. In FIG. 5, the same reference numeral as in FIG. 1 is given to a component corresponding to each component shown in FIG. 1.

In the first embodiment mentioned above, each source of the MOSFETs 11 to 14 (each anode of the PN junction diodes 11a to 14a) is connected to each corresponding anode of the Schottky barrier diodes 21 to 24 through the connection metal members 31, 33, 35, and 37, respectively.

On the other hand, in the third embodiment, each source of the MOSFETs 11 to 14 (each anode of the PN junction diodes 11a to 14a) is connected to an output line through connection metal members 31B, 33B, 35B, and 37B parasitized by the inductances L1, L3, L5, and L7, respectively. Herein, the reference numeral that designates the inductance is set to be the same as that of the first embodiment merely for convenience, and this does not mean that the inductances of the connection metal members 31B to 38B are respectively equal to the inductances of the connection metal members 31 to 38 mentioned in the first embodiment.

The detailed structure is as follows. The source of the first MOSFET 11 (i.e., the anode of the first PN junction diode 11a) is connected to the output terminal 42 of the first module 2B through the connection metal member 31B. In other words, the source of the first MOSFET 11 (i.e., the anode of the first PN junction diode 11a) is connected to the second output line 18 through the connection metal member 31B.

The source of the second MOSFET 12 (i.e., the anode of the second PN junction diode 12a) is connected to the second power source terminal 43 of the first module 2B through the connection metal member 33B. In other words, the source of the second MOSFET 12 (i.e., the anode of the second PN junction diode 12a) is connected to the third output line 19 through the connection metal member 33B.

The source of the third MOSFET 13 (i.e., the anode of the third PN junction diode 13a) is connected to the output terminal 47 of the second module 3B through the connection metal member 35B. In other words, the source of the third MOSFET (i.e., the anode of the third PN junction diode 13a) is connected to the second output line 18 through the connection metal member 35B.

The source of the fourth MOSFET 14 (i.e., the anode of the fourth PN junction diode 14a) is connected to the second power source terminal 48 of the second module 3B through the connection metal member 37B. In other words, the source of the fourth MOSFET 14 (i.e., the anode of the fourth PN junction diode 14a) is connected to the third output line 19 through the connection metal member 37B.

As in the first embodiment, the anodes of the first and third Schottky barrier diodes 21 and 23 are connected to the second output line 18 through the connection metal members 32B and 36B parasitized by the inductances L2 and L6, respectively. As in the first embodiment, the anodes of the second and fourth Schottky barrier diodes 22 and 24 are connected to the third output line 19 through the connection metal members 34B and 38B parasitized by the inductances L4 and L8, respectively.

In the third embodiment, the inductances L1, L3, L5, and L7 parasitizing the connection metal members 31B, 33B, 35B, and 37B are set to be greater than the inductances L2, L4, L6, and L8 parasitizing the connection metal members 32B, 34B, 36B, and 38B, respectively. In other words, the relations L1>L2, L3>L4, L5>L6, and L7>L8 are established. For example, if each of the connection metal members 31B to 38B is a bonding wire, the inductances L1 to L8 can be adjusted by adjusting the length of the bonding wire, the diameter of the bonding wire, the loop angle of the bonding wire, etc. The inductance becomes greater in proportion to an increase in the length of the bonding wire, in proportion to a decrease in the diameter of the bonding wire, or in proportion to an increase in the loop angle of the bonding wire.

When the first MOSFET 11 and the fourth MOSFET 14 are turned on, an electric current flows from the positive electrode of the power source 15 toward the third output line 19 through the first output line 17, the first MOSFET 11, the connection metal member 31B, the second output line 18, the load 16, the second output line 18, the fourth MOSFET 14, and the connection metal member 37B. In this case, the current flows through the load 16 in the direction shown by arrow "A."

When all of the MOSFETs 11 to 14 are brought into an OFF state from this state, the inductance of the inductive load 16 maintains an electric current flowing through the load 16 (i.e., maintains the current flowing in the direction shown by arrow "A"). Therefore, the current flows through the connection metal wire 34B, the second Schottky barrier diode 22, the load 16, the connection metal wire 36B, and the third Schottky barrier diode 23 in the direction from the connection metal wire 34B toward the third Schottky barrier diode 23. As a result, the current flows through the connection metal wire 34B and the connection metal wire 36B.

When the current flows through the connection metal wire 34B, a counter electromotive force is generated by the inductance L4 parasitizing this metal wire. The counter electromotive force generated by the inductance L4 is supplied to the connection metal wire 33B. However, the inductance L3 parasitizing the connection metal wire 33B is greater than the inductance L4, and therefore the energy of the counter electromotive force is absorbed by the inductance L3. Therefore, the second PN junction diode 12a does not receive a voltage greater than its forward voltage Vf2. Therefore, the current does not flow through the second PN junction diode 12a.

Likewise, when the current flows through the connection metal wire 36B, a counter electromotive force is generated by the inductance L6 parasitizing this metal wire. The counter electromotive force generated by the inductance L6 is supplied to the connection metal wire 35B. However, the inductance L5 parasitizing the connection metal wire 35B is greater than the inductance L6, and therefore the energy of the counter electromotive force is absorbed by the inductance L5. Therefore, the third PN junction diode 13a does not receive a voltage greater than its forward voltage Vf2. Therefore, the current does not flow through the third PN junction diode 13a.

When the second MOSFET 12 and the third MOSFET 13 are turned on, an electric current flows from the positive electrode of the power source 15 toward the third output line 19 through the first output line 17, the third MOSFET 13, the connection metal member 35B, the second output line 18, the load 16, the second output line 18, the second MOSFET 12, and the connection metal member 33B. In this case, the current flows through the load 16 in the direction shown by arrow B.

When all of the MOSFETs 11 to 14 are brought into an OFF state from this state, the inductance of the inductive load 16 maintains an electric current flowing through the load 16 (i.e., maintains the current flowing in the direction shown by arrow B). Therefore, the current flows through the connection metal wire 38B, the fourth Schottky barrier diode 24, the load 16, the connection metal wire 32B, and the first Schottky barrier diode 21 in the direction from the connection metal wire 38B toward the first Schottky barrier diode 21. As a result, the current flows through the connection metal wire 38B and the connection metal wire 32B.

When the current flows through the connection metal wire 38B, a counter electromotive force is generated by the inductance L8 parasitizing this metal wire. The counter electromotive force generated by the inductance L8 is supplied to the connection metal wire 37B. However, the inductance L7 parasitizing the connection metal wire 37B is greater than the inductance L8, and therefore the energy of the counter electromotive force is absorbed by the inductance L7. Therefore, the fourth PN junction diode 14a does not receive a voltage greater than its forward voltage Vf2. Therefore, the current does not flow through the fourth PN junction diode 14a.

Likewise, when the current flows through the connection metal wire 32B, a counter electromotive force is generated by the inductance L2 parasitizing this metal wire. The counter electromotive force generated by the inductance L2 is supplied to the connection metal wire 31B. However, the inductance L1 parasitizing the connection metal wire 31B is greater than the inductance L2, and therefore the energy of the counter electromotive force is absorbed by the inductance L1. Therefore, the first PN junction diode 11a does not receive a voltage greater than its forward voltage Vf2. Therefore, the current does not flow through the first PN junction diode 11a.

As described above, in the third embodiment, an electric current can be restrained from flowing through the PN junction diodes 11a to 14a built in the MOSFETs 11 to 14, respectively, during a dead time period in the same way as in the first embodiment. Therefore, a forward direction deterioration of the MOSFETs 11 to 14 can be prevented.

Figure 6:
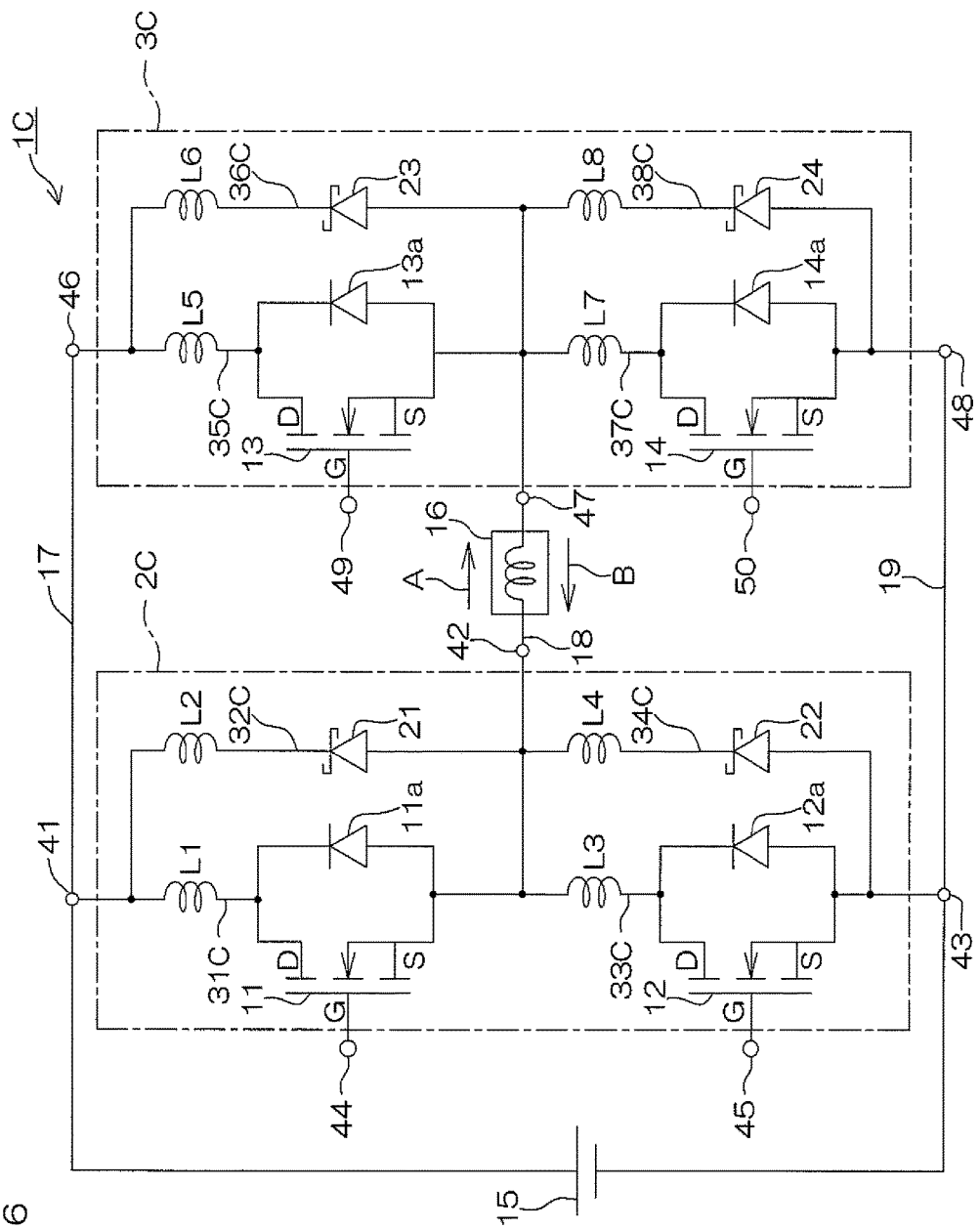
FIG. 6 is an electric circuit diagram showing an inverter circuit according to a fourth embodiment of the present invention.

FIG. 6 is an electric circuit diagram showing an inverter circuit 1C according to a fourth embodiment of the present invention. In FIG. 6, the same reference numeral as in FIG. 1 is given to a component corresponding to each component shown in FIG. 1.

In the first embodiment mentioned above, the drain electrode of each of the MOSFETs 11 to 14 and the cathode electrode of each of the Schottky barrier diodes 21 to 24 are joined to the die pad in each package as in the package 4 of FIG. 3. On the other hand, in the fourth embodiment, the source electrode of each of the MOSFETs 11 to 14 and the anode electrode of each of the Schottky barrier diodes 21 to 24 are joined to the die pad in each package. Therefore, in each package, the drain electrode is formed on the surface of each of the MOSFETs 11 to 14 that is on the side opposite to the die pad, and the cathode electrode is formed on the surface of each of the Schottky barrier diodes 21 to 24 that is on the side opposite to the die pad.

Referring to FIG. 6, the source of the first MOSFET 11 (i.e., the anode of the first PN junction diode 11a) and the anode of the first Schottky barrier diode 21 are connected to an output terminal 42 of a first module 2C. The drain of the first MOSFET 11 (i.e., the cathode of the first PN junction diode 11a) is connected to a first power source terminal 41 of the first module 2C by means of a connection metal member 31C parasitized by the inductance L1. The cathode of the first Schottky barrier diode 21 is connected to the first power source terminal 41 of the first module 2C by means of a connection metal member 32C parasitized by the inductance L2. In other words, the cathode of the first PN junction diode 11a is connected to the first output line 17 through the connection metal member 31C, and the cathode of the first Schottky barrier diode 21 is connected to the first output line 17 through the connection metal member 32C.

The source of the second MOSFET 12 (i.e., the anode of the second PN junction diode 12a) and the anode of the second Schottky barrier diode 22 are connected to a second power source terminal 43 of the first module 2C. The drain of the second MOSFET 12 (i.e., the cathode of the second PN junction diode 12a) is connected to an output terminal 42 of the first module 2C by means of a connection metal member 33C parasitized by the inductance L3. The cathode of the second Schottky barrier diode 22 is connected to the output terminal 42 of the first module 2C by means of a connection metal member 34C parasitized by the inductance L4. In other words, the cathode of the second PN junction diode 12a is connected to the second output line 18 through the connection metal member 33C, and the cathode of the second Schottky barrier diode 22 is connected to the second output line 18 through the connection metal member 34C.

The source of the third MOSFET 13 (i.e., the anode of the third PN junction diode 13a) and the anode of the third Schottky barrier diode 23 are connected to an output terminal 47 of a second module 3C. The drain of the third MOSFET 13 (i.e., the cathode of the third PN junction diode 13a) is connected to the first power source terminal 46 of the second module 3C by means of a connection metal member 35C parasitized by the inductance L5. The cathode of the third Schottky barrier diode 23 is connected to the first power source terminal 46 of the second module 3C by means of a connection metal member 36C parasitized by the inductance L6. In other words, the cathode of the third PN junction diode 13a is connected to the first output line 17 through the connection metal member 35C, and the cathode of the third Schottky barrier diode 23 is connected to the first output line 17 through the connection metal member 36C.

The source of the fourth MOSFET 14 (i.e., the anode of the fourth PN junction diode 14a) and the anode of the fourth Schottky barrier diode 24 are connected to a second power source terminal 48 of the second module 3C. The drain of the fourth MOSFET 14 (i.e., the cathode of the fourth PN junction diode 14a) is connected to the output terminal 47 of the second module 3C by means of a connection metal member 37C parasitized by the inductance L7. The cathode of the fourth Schottky barrier diode 24 is connected to the output terminal 42 of the second module 3C by means of a connection metal member 38C parasitized by the inductance L8. In other words, the cathode of the fourth PN junction diode 14a is connected to the second output line 18 through the connection metal member 37C, and the cathode of the fourth Schottky barrier diode 24 is connected to the second output line 18 through the connection metal member 38C.

Although the reference numeral that designates the inductance is, for convenience, set to be the same as that of the first embodiment, this does not mean that the inductances of the connection metal members 31C to 38C are respectively equal to the inductances of the connection metal members 31 to 38 mentioned in the first embodiment.

In the fourth embodiment, the inductances L1, L3, L5, and L7 parasitizing the connection metal members 31C, 33C, 35C, and 37C are set to be greater than the inductances L2, L4, L6, and L8 parasitizing the connection metal members 32C, 34C, 36C, and 38C, respectively. In other words, the relations L1>L2, L3>L4, L5>L6, and L7>L8 are established. For example, if each of the connection metal members 31C to 38C is a bonding wire, the inductances L1 to L8 can be adjusted by adjusting the length of the bonding wire, the diameter of the bonding wire, the loop angle of the bonding wire, etc.

When the first MOSFET 11 and the fourth MOSFET 14 are turned on, an electric current flows from the positive electrode of the power source 15 toward the third output line 19 through the first output line 17, the connection metal member 31C, the first MOSFET 11, the second output line 18, the load 16, the second output line 18, the connection metal member 37C, and the fourth MOSFET 14. In this case, the current flows through the load 16 in the direction shown by arrow "A."

When all of the MOSFETs 11 to 14 are brought into an OFF state from this state, the inductance of the inductive load 16 maintains an electric current flowing through the load 16 (i.e., maintains the current flowing in the direction shown by arrow "A"). Therefore, the current flows through the second Schottky barrier diode 22, the connection metal wire 34C, the load 16, the third Schottky barrier diode 23, and the connection metal wire 36C in the direction from the second Schottky barrier diode 22 toward the connection metal wire 36C. As a result, the current flows through the connection metal wire 34C and the connection metal wire 36C.

When the current flows through the connection metal wire 34C, a counter electromotive force is generated by the inductance L4 parasitizing this metal wire. The counter electromotive force generated by the inductance L4 is supplied to the connection metal wire 33C. However, the inductance L3 parasitizing the connection metal wire 33C is greater than the inductance L4, and therefore the energy of the counter electromotive force is absorbed by the inductance L3. Therefore, the second PN junction diode 12a does not receive a voltage greater than its forward voltage Vf2. Therefore, the current does not flow through the second PN junction diode 12a.

Likewise, when the current flows through the connection metal wire 36C, a counter electromotive force is generated by the inductance L6 parasitizing this metal wire. The counter electromotive force generated by the inductance L6 is supplied to the connection metal wire 35C. However, the inductance L5 parasitizing the connection metal wire 35C is greater than the inductance L6, and therefore the energy of the counter electromotive force is absorbed by the inductance L5. Therefore, the third PN junction diode 13a does not receive a voltage greater than its forward voltage Vf2. Therefore, the current does not flow through the third PN junction diode 13a.

When the second MOSFET 12 and the third MOSFET 13 are turned on, an electric current flows from the positive electrode of the power source 15 toward the third output line 19 through the first output line 17, the connection metal member 35C, the third MOSFET 13, the second output line 18, the load 16, the second output line 18, the connection metal member 33C, and the second MOSFET 12. In this case, the current flows through the load 16 in the direction shown by arrow B.

When all of the MOSFETs 11 to 14 are brought into an OFF state from this state, the inductance of the inductive load 16 maintains an electric current flowing through the load 16 (i.e., maintains the current flowing in the direction shown by arrow B). Therefore, the current flows through the fourth Schottky barrier diode 24, the connection metal wire 38C, the load 16, the first Schottky barrier diode 21, and the connection metal wire 32C in the direction from the fourth Schottky barrier diode 24 toward the connection metal wire 32C. As a result, the current flows through the connection metal wire 38C and the connection metal wire 32C.

When the current flows through the connection metal wire 38C, a counter electromotive force is generated by the inductance L8 parasitizing this metal wire. The counter electromotive force generated by the inductance L8 is supplied to the connection metal wire 37C. However, the inductance L7 parasitizing the connection metal wire 37C is greater than the inductance L8, and therefore the energy of the counter electromotive force is absorbed by the inductance L7. Therefore, the fourth PN junction diode 14a does not receive a voltage greater than its forward voltage Vf2. Therefore, the current does not flow through the fourth PN junction diode 14a.

Likewise, when the current flows through the connection metal wire 32C, a counter electromotive force is generated by the inductance L2 parasitizing this metal wire. The counter electromotive force generated by the inductance L2 is supplied to the connection metal wire 31C. However, the inductance L1 parasitizing the connection metal wire 31C is greater than the inductance L2, and therefore the energy of the counter electromotive force is absorbed by the inductance L1. Therefore, the first PN junction diode 11a does not receive a voltage greater than its forward voltage Vf2. Therefore, the current does not flow through the first PN junction diode 11a.

As described above, in the fourth embodiment, an electric current can be restrained from flowing through the PN junction diodes 11a to 14a built in the MOSFETs 11 to 14, respectively, during a dead time period in the same way as in the first embodiment. Therefore, a forward direction deterioration of the MOSFETs 11 to 14 can be prevented.

Figure 7:
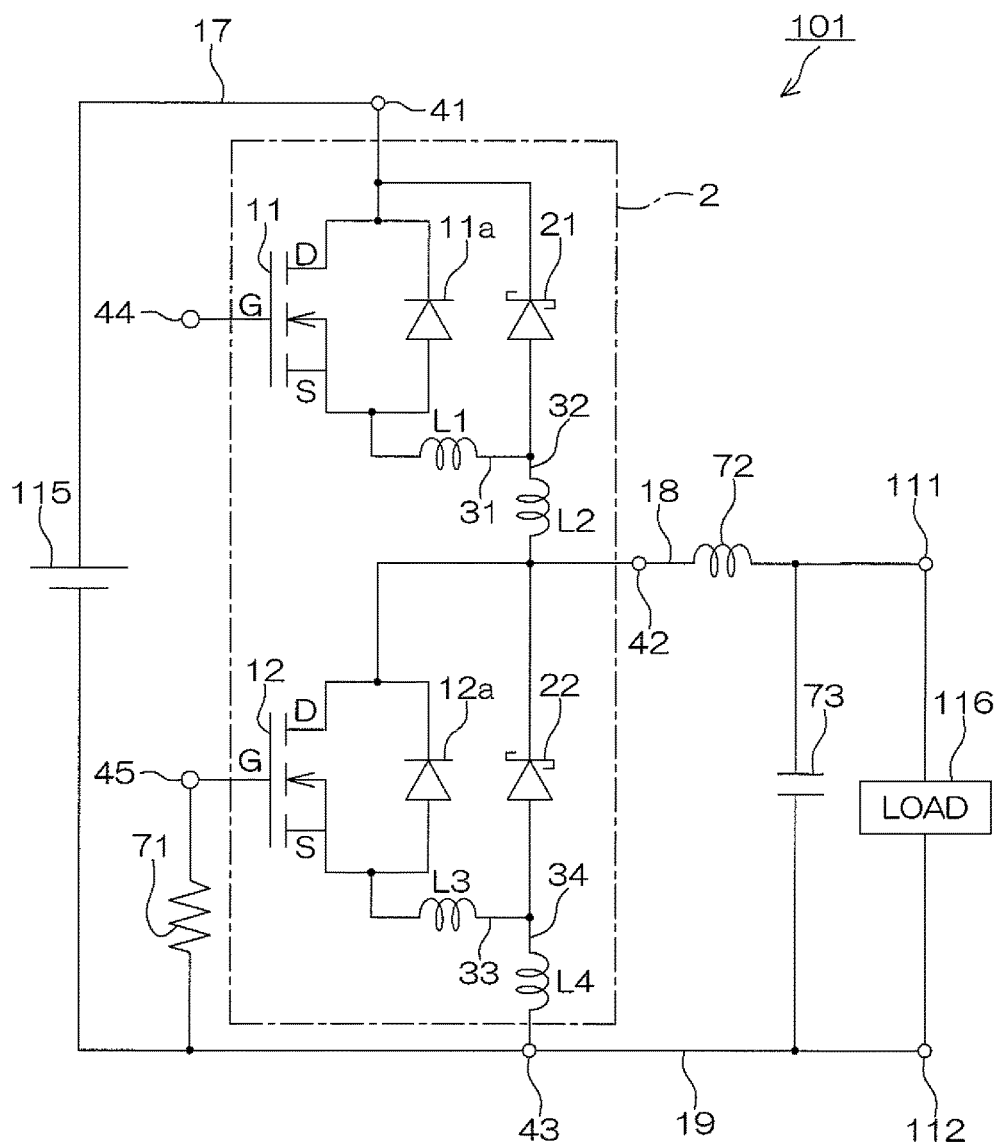
FIG. 7 is an electric circuit diagram showing a converter circuit according to a fifth embodiment of the present invention.

FIG. 7 is an electric circuit diagram showing a converter circuit 101 to which an electronic circuit according to a fifth embodiment of the present invention is applied.

This converter circuit 101 is a step-down DC-DC converter circuit. The converter circuit 101 includes a module 2, a coil 72, and a capacitor 73. The module 2 is the same in structure as the first module 2 of the first embodiment. The first power source terminal 41 of the module 2 is connected to a positive electrode terminal of a power source 115 through the first output line 17. The second power source terminal 43 of the module 2 is connected to a negative electrode terminal of the power source 115 through the third output line 19. The output terminal 42 of the module 2 is connected to a first outside terminal 111 through the second output line 18 and the coil 72. The second power source terminal 43 of the module 2 is connected to a second outside terminal 112 through the third output line 19.

The capacitor 73 is connected to a portion between a connection point that is located between the coil 72 and the first outside terminal 111 and the third output line 19 that is located between the second power source terminal 43 and the second outside terminal 112. The coil 72 and the capacitor 73 forma smoothing circuit. A load 116 is connected to a portion between the first outside terminal 111 and the second outside terminal 112. The gate terminal 45 of the module 2 is connected to the third output line 19 through a resistor 71. A control unit (not shown) is connected to the gate terminal 44 of the module 2.

The module 2 includes a first high-side MOSFET 11 and a second low-side MOSFET 12 that is connected in series to the first MOSFET 11. The MOSFETs 11 and 12 have a first PN junction diode (body diode) 11a built in and a second PN junction diode 12a built in, respectively. Each of these PN junction diodes 11a and 12a is a bipolar device.

The first Schottky barrier diode 21 that is a unipolar device and the second Schottky barrier diode 22 that is a unipolar device are connected in parallel to the MOSFETs 11 and 12, respectively. In other words, the Schottky barrier diodes 21 and 22 each of which is a unipolar device are connected in parallel to the PN junction diodes 11a and 12a each of which is a bipolar device.

The drain of the first MOSFET 11 is connected to the first power source terminal 41 of the module 2. The cathode of the first Schottky barrier diode 21 is connected to the drain of the first MOSFET 11 (i.e., to the cathode of the first PN junction diode 11a). The source of the first MOSFET 11 (i.e., the anode of the first PN junction diode 11a) is connected to the anode of the first Schottky barrier diode 21 through the connection metal member 31 parasitized by the inductance L1. The anode of the first Schottky barrier diode 21 is connected to the output terminal 42 of the module 2 through the connection metal member 32 parasitized by the inductance L2. In other words, the anode of the first Schottky barrier diode 21 is connected to the second output line 18 through the connection metal member 32 parasitized by the inductance L2.

The drain of the second MOSFET 12 is connected to the output terminal 42 of the module 2. The cathode of the second Schottky barrier diode 22 is connected to the drain of the second MOSFET 12 (i.e., to the cathode of the second PN junction diode 12a). The source of the second MOSFET 12 (i.e., the anode of the second PN junction diode 12a) is connected to the anode of the second Schottky barrier diode 22 through the connection metal member 33 parasitized by the inductance L3. The anode of the second Schottky barrier diode 22 is connected to the second power source terminal 43 of the module 2 through the connection metal member 34 parasitized by the inductance L4. In other words, the anode of the second Schottky barrier diode 22 is connected to the third output line 19 through the connection metal member 34 parasitized by the inductance L4.

Each of the MOSFETs 11 and 12 is an SiC device in which, for example, SiC (silicon carbide) that is an example of a compound semiconductor is used as a semiconducting material. The forward voltage Vf1 of each of the Schottky barrier diodes 21 and 22 is lower than the forward voltage Vf2 of each of the PN junction diodes 11a and 12a. The forward voltage Vf2 of each of the PN junction diodes 11a and 12a is, for example, 2.0 V. The forward voltage Vf1 of each of the Schottky barrier diodes 21 and 22 is, for example, 1.0 V.

In the thus arranged converter circuit 101, the first MOSFET 11 is turned on/off (is switched) at a predetermined duty ratio. When the first MOSFET 11 is turned on, an electric current flows from a positive electrode of a power source 115 toward a load 116 through the first output line 17, the first MOSFET 11, the connection metal member 31, the connection metal member 32, the second output line 18, and the coil 72 (the smoothing circuit). As a result, energy is stored in the coil 72, and electric power is supplied to the load 116.

When the first MOSFET 11 is turned off, the coil 72 attempts to maintain an electric current flowing therethrough, and generates an electromotive force. This electromotive force allows the current to flow through the coil 72 through the connection metal member 34 and the second Schottky barrier diode 22, and electric power is supplied to the load 116. This operation is repeatedly performed, and, as a result, a voltage lower than the voltage of the power source 115 is applied to the load 116.

As described above, when the first MOSFET 11 is changed from an ON state to an OFF state, an electric current flows through the connection metal member 34 by an electromotive force generated by the coil 72. When the current flows through the connection metal member 34, a counter electromotive force is generated by the inductance L4 parasitizing this metal member. However, the voltage of this counter electromotive force is not applied to the second PN junction diode 12a. The reason is that the anode of the second PN junction diode 12a is connected to the anode of the second Schottky barrier diode 22 by means of the connection metal wire 33. Only a voltage equivalent to the forward voltage Vf1 of the second Schottky barrier diode 22 is applied to the first PN junction diode 11a. In other words, the second PN junction diode 12a does not receive a voltage greater than its forward voltage Vf2. Therefore, the current does not flow through the second PN junction diode 12a.

As described above, in the fifth embodiment, an electric current can be restrained from flowing through the PN junction diode 12a built in the second MOSFET 12 when the first MOSFET 11 is changed from an ON state to an OFF state. Therefore, a forward direction deterioration of the MOSFET 12 can be prevented.

The source of the first MOSFET 11 may be connected to the output terminal 42 by means of the connection metal member 31, and the source of the second MOSFET 12 may be connected to the second power source terminal 43 by means of the connection metal member 33 in the same way as in the first module 2B of the third embodiment. However, in this case, the inductances L1 and L3 parasitizing the connection metal members 31 and 33, respectively, are set to be greater than the inductances L2 and L4 parasitizing the connection metal members 32 and 34, respectively.

The module 2 can also be used in a step-up DC-DC converter. In this case, a power source is connected to a portion between the terminals 42 and 43 of the module 2, and a smoothing circuit consisting of a coil and a capacitor is connected to a portion between the terminals 41 and 43 of the module 2. Furthermore, a load is connected in parallel to the capacitor. The gate terminal 44 of the first MOSFET 11 is grounded through a resistor. Thereafter, the second MOSFET 12 is switched. In the thus arranged stet-up DC-DC converter, when the second MOSFET 12 is turned off, an electric current does not flow through the PN junction diode 11a of the first MOSFET 11 in the same way as in the step-down DC-DC converter mentioned above.

Figure 8:
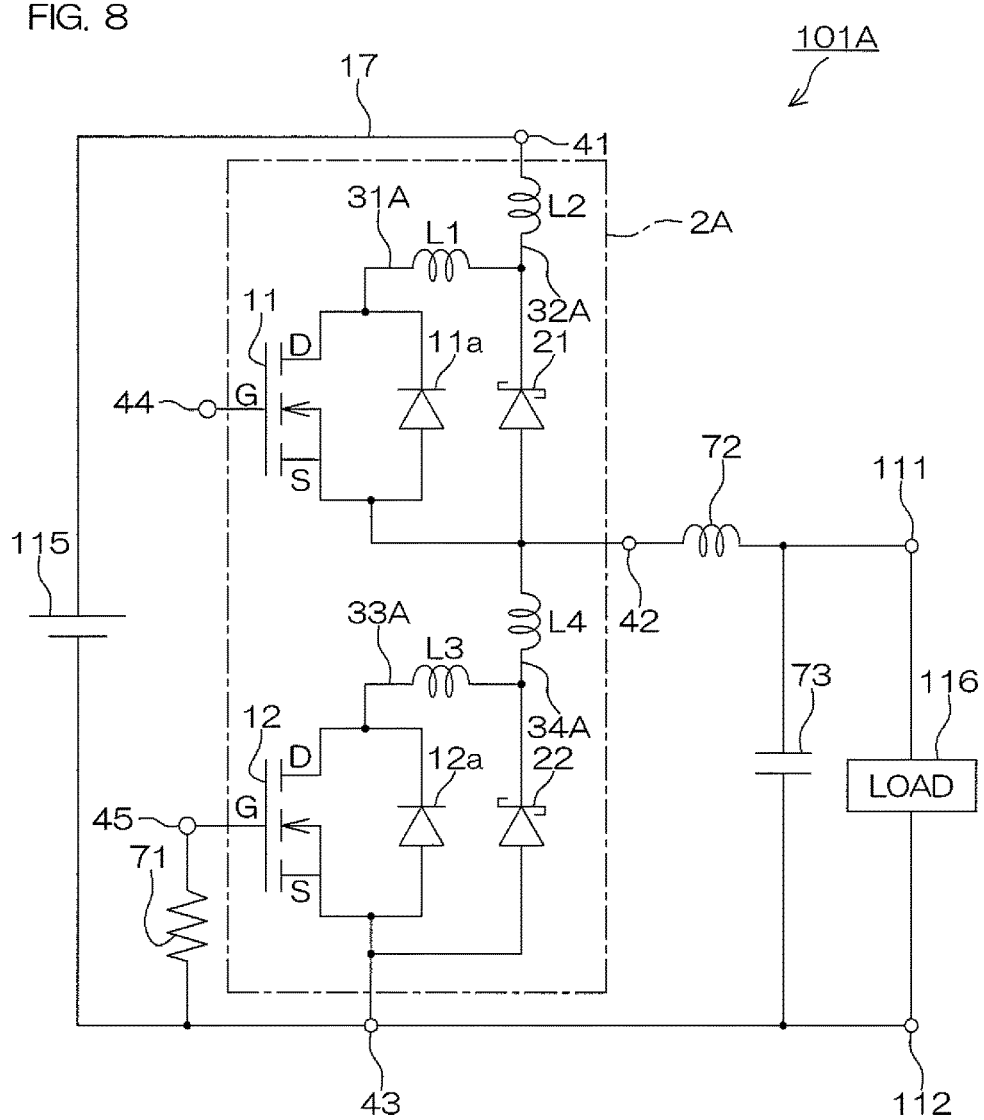
FIG. 8 is an electric circuit diagram showing a converter circuit according to a sixth embodiment of the present invention.

FIG. 8 is an electric circuit diagram showing a converter circuit 101A according to a sixth embodiment of the present invention. In FIG. 8, the same reference numeral as in FIG. 7 is given to a component corresponding to each component shown in FIG. 7.

The converter circuit 101A differs from the converter circuit 101 of the fifth embodiment in the arrangement of the module 2A. The arrangement of the module 2 of the fifth embodiment is the same as that of the first module 2 of the first embodiment. On the other hand, the arrangement of the module 2A of the sixth embodiment is the same as that of the first module 2A of the second embodiment.

Referring to FIG. 8, the source of the first MOSFET 11 (i.e., the anode of the first PN junction diode 11a) and the anode of the first Schottky barrier diode 21 are connected to the output terminal 42 of the first module 2A. The drain of the first MOSFET 11 (i.e., the cathode of the first PN junction diode 11a) is connected to the cathode of the first Schottky barrier diode 21 by means of the connection metal member 31A parasitized by the inductance L1. The cathode of the first Schottky barrier diode 21 is connected to the first power source terminal 41 of the module 2A by means of the connection metal member 32A parasitized by the inductance L2. In other words, the cathode of the first Schottky barrier diode 21 is connected to the first output line 17 through the connection metal member 32A parasitized by the inductance L2.

The source of the second MOSFET 12 (i.e., the anode of the second PN junction diode 12a) and the anode of the second Schottky barrier diode 22 are connected to the second power source terminal 43 of the module 2A. The drain of the second MOSFET 12 (i.e., the cathode of the second PN junction diode 12a) is connected to the cathode of the second Schottky barrier diode 22 by means of the connection metal member 33A parasitized by the inductance L3. The cathode of the second Schottky barrier diode 22 is connected to the output terminal 42 of the module 2A by means of the connection metal member 34A parasitized by the inductance L4. In other words, the cathode of the second Schottky barrier diode 22 is connected to the second output line 18 through the connection metal member 34A parasitized by the inductance L4.

Each of the MOSFETs 11 and 12 is an SiC device in which, for example, SiC (silicon carbide) that is an example of a compound semiconductor is used as a semiconducting material. The forward voltage Vf1 of each of the Schottky barrier diodes 21 and 22 is lower than the forward voltage Vf2 of each of the PN junction diodes 11a and 12a. The forward voltage Vf2 of each of the PN junction diodes 11a and 12a is, for example, 2.0 V. The forward voltage Vf1 of each of the Schottky barrier diodes 21 and 22 is, for example, 1.0 V.

The gate terminal 45 of the module 2A is connected to the third output line 19 through the resistor 71. A control unit (not shown) is connected to the gate terminal 44 of the module 2A.

In the thus arranged converter circuit 101A, the first MOSFET 11 is turned on/off (is switched) at a predetermined duty ratio. When the first MOSFET 11 is turned on, an electric current flows from the positive electrode of the power source 115 toward the load 116 through the first output line 17, the connection metal member 32A, the connection metal member 31A, the first MOSFET 11, the second output line 122, and the coil 72 (the smoothing circuit). As a result, energy is stored in the coil 72, and electric power is supplied to the load 116.

When the first MOSFET 11 is turned off, the coil 72 attempts to maintain an electric current flowing therethrough, and generates an electromotive force. This electromotive force allows the current to flow to the load 116 through the second Schottky barrier diode 22 and the connection metal member 34A, and electric power is supplied to the load 116. This operation is repeatedly performed, and, as a result, a voltage lower than the voltage of the power source 115 is applied to the load 116.

As described above, when the first MOSFET 11 is changed from an ON state to an OFF state, an electric current flows through the connection metal member 34A by an electromotive force generated by the coil 72. When the current flows through the connection metal member 34A, a counter electromotive force is generated by the inductance L4 parasitizing this metal member. However, the voltage of this counter electromotive force is not applied to the second PN junction diode 12a. The reason is that the cathode of the second PN junction diode 12a is connected to the cathode of the second Schottky barrier diode 22 by means of the connection metal wire 33A. Only a voltage equivalent to the forward voltage Vf1 of the second Schottky barrier diode 22 is applied to the second PN junction diode 12a. In other words, the second PN junction diode 12a does not receive a voltage greater than its forward voltage Vf2. Therefore, the current does not flow through the second PN junction diode 12a.

As described above, also in the sixth embodiment, an electric current can be restrained from flowing through the PN junction diode 12a built in the second MOSFET 12 when the first MOSFET 11 is changed from an ON state to an OFF state. Therefore, a forward direction deterioration of the MOSFET 12 can be prevented.

The drain of the first MOSFET 11 may be connected to the first power source terminal 41 by means of the connection metal member 31A, and the drain of the second MOSFET 12 may be connected to the output terminal 42 by means of the connection metal member 33A in the same way as in the first module 2C of the fourth embodiment. However, in this case, the inductances L1 and L3 parasitizing the connection metal members 31A and 33A, respectively, are set to be greater than the inductances L2 and L4 parasitizing the connection metal members 32A and 34A, respectively.

Additionally, the module 2A can be used in a step-up DC-DC converter. In this case, a power source is connected to a portion between the terminals 42 and 43 of the module 2A, and a smoothing circuit consisting of a coil and a capacitor is connected to a portion between the terminals 41 and 43 of the module 2A. Furthermore, a load is connected in parallel to the capacitor. The gate terminal 44 of the first MOSFET 11 is grounded through a resistor. Thereafter, the second MOSFET 12 is switched. In the thus arranged set-up DC-DC converter, when the second MOSFET 12 is turned off, an electric current does not flow through the PN junction diode 11a of the first MOSFET 11 in the same way as in the step-down DC-DC converter mentioned above.

Although the six embodiments of the present invention have been described above, the present invention can be embodied in other forms. For example, each of the MOSFETs 11, 12, 13, and 14 may be an Si device in which Si (silicon) is used as a semiconducting material although each thereof is an SiC device in the above embodiments.

Although the embodiments of the present invention have been described in detail as above, these are merely specific examples used to clarify the technical contents of the present invention, and the present invention should not be understood as being limited to these examples, and the scope of the present invention is to be determined solely by the appended claims.

The present application corresponds to Japanese Patent Application No. 2010-121375 filed in the Japan Patent Office on May 27, 2010, and the entire disclosure of the application is incorporated herein by reference.

DESCRIPTION OF SIGNS 1, 1A, 1B, 1C Inverter circuit
2, 2A, 2B, 2C Module
3, 3A, 3B, 3C Module
11 to 14 MOSFET
11a to 14a PN junction diode
21 to 24 Schottky barrier diode
31 to 38, 31A to 38A, 31B to 38B, 31C to 38C Connection metal member
72 Coil

The invention claimed is:
1. A semiconductor device comprising:
an SiC-MOSFET which is a semiconductor device made of a semiconducting material that chiefly includes SiC;

a Schottky barrier diode;

a die pad to which a drain of the SiC-MOSFET and a cathode of the Schottky barrier diode are bonded;

an outside terminal to which the SiC-MOSFET and the Schottky barrier diode are connected; and a metal member entirely made of and integrally formed of a same material, the metal member being connected to a source of the SiC-MOSFET, an anode of the Schottky barrier diode, and the outside terminal, wherein an inductance of the metal member from the Schottky barrier diode to the outside terminal is smaller than an inductance of the metal member from the SiC-MOSFET to the outside terminal.

2. The semiconductor device according to claim 1, wherein the SiC-MOSFET includes a PN junction diode, and the metal member connects the anode of the Schottky barrier diode and an anode of the PN junction diode.

3. The semiconductor device according to claim 2, wherein the metal member is chiefly made of copper.

4. The semiconductor device according to claim 3, wherein the metal member is a ribbon which is a flexible belt-like connection member or a frame which is a less flexible plate-like metallic member.

5. The semiconductor device according to claim 3, wherein the SiC-MOSFET and the Schottky barrier diode are arranged along a predetermined one direction with a distance therebetween on the die pad, a source terminal which is the outside terminal is arranged at a position separated toward a direction perpendicular to the predetermined one direction when viewed in plan.

6. The semiconductor device according to claim 5, wherein the source terminal is arranged closer to the Schottky barrier diode than to the SiC-MOSFET.

7. The semiconductor device according to claim 6, wherein a gate terminal is arranged with a distance from the source terminal in a direction parallel to the predetermined one direction and approaching to the SiC-MOSFET, and the SiC-MOSFET has a gate at a position close to the gate terminal on a surface thereof having a source.

8. A module, comprising:

an upper arm including a semiconductor device according to claim 1; and a lower arm including a semiconductor device according to claim 1, wherein a source of the SiC-MOSFET in the upper arm is connected to a drain of the SiC-MOSFET in the lower arm.

9. An inverter circuit, comprising:

a first module including a module according to claim 8, and a second module including a module according to claim 8, wherein a load is to be connected between a connection point of the upper and lower arms in the first module and another connection point of the upper and lower arms in the second module.

10. A converter, comprising the module according to claim 8.

11. A driving method of the module according to claim 8, wherein the SiC-MOSFETs included in the first and second arms have respective PN junction diodes, the SiC-MOSFET in the upper arm and the SiC-MOSFET in the lower arm are alternately turned on with a dead time period being intervened, no current flows through the PN junction diode during the dead time period.

12. A semiconductor device, comprising:

a bipolar device made of a semiconducting material including SiC, and including a PN junction diode, a unipolar device including a Schottky barrier diode;

a die pad to which the bipolar device and the unipolar device are bonded;

an outside terminal to which a cathode side surface of the PN junction diode in the bipolar device and a cathode side surface of the Schottky barrier diode in the unipolar device are connected; and a metal member entirely made of and integrally formed of a same material, the metal member being connected to an anode side surface of the PN junction diode in the bipolar device, an anode side surface of the Schottky barrier diode in the unipolar device, and the outside terminal, wherein an inductance of the metal member from the bipolar device to the outside terminal is larger than an inductance of the metal member from the unipolar device to the outside terminal.

* * * * *